US012658225B2

(12) United States Patent　　(10) Patent No.:　US 12,658,225 B2
Kwon et al.　　　　　　　　　　(45) Date of Patent:　　Jun. 16, 2026

(54) MEMORY DEVICE INCLUDING COMPRESSING AND MERGE CIRCUITS AND OPERATING METHOD OF THE MEMORY DEVICE

(71) Applicant: SK hynix Inc., Icheon-si (KR)

(72) Inventors: Chan Keun Kwon, Icheon-si (KR); Hyeon Cheon Seol, Icheon-si (KR); Sung Hwa Ok, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 200 days.

(21) Appl. No.: 18/427,006

(22) Filed: Jan. 30, 2024

(65) Prior Publication Data

US 2025/0054526 A1　　Feb. 13, 2025

(30) Foreign Application Priority Data

Aug. 7, 2023　　(KR) ........................ 10-2023-0102845

(51) Int. Cl.
　　*G11C 7/10*　　　　(2006.01)
　　*G11C 7/22*　　　　(2006.01)
(52) U.S. Cl.
　　CPC .......... *G11C 7/1069* (2013.01); *G11C 7/1066* (2013.01); *G11C 7/222* (2013.01)
(58) Field of Classification Search
　　CPC ..... G11C 7/1069; G11C 7/1066; G11C 7/222; G11C 7/1006; G11C 7/1057; G11C 7/106;

(Continued)

(56) References Cited

U.S. PATENT DOCUMENTS

2010/0110802 A1* 5/2010 Momma .............. G11C 7/1006
　　　　　　　　　　　　　　　　365/219
2013/0315007 A1* 11/2013 Cha ........................ G11C 29/40
　　　　　　　　　　　　　　　　365/189.07

(Continued)

FOREIGN PATENT DOCUMENTS

KR　　1020080022628 A　　3/2008
KR　　1020080046345 A　　5/2008

(Continued)

*Primary Examiner* — Amir Zarabian
*Assistant Examiner* — Bradley S Coon
(74) *Attorney, Agent, or Firm* — WILLIAM PARK AND ASSOCIATES LTD.

(57) ABSTRACT

A memory device includes: a plurality of memory planes each including a plurality of memory banks, the plurality of memory planes being grouped into memory planes; a plurality of compressing circuits respectively connected to the plurality of memory banks, the plurality of compressing circuits outputting compressed data by respectively compressing data read from the plurality of memory; a plurality of first merge circuits receiving the compressed data and output control signals corresponding to at least a portion of the memory banks, the plurality of first merge circuits outputting first merged data obtained by merging compressed data corresponding to memory banks grouped as a first merge group; a second merge circuit outputting second merged data obtained by merging first merged data generated from memory banks included in the same plane group; and an output buffer circuit outputting the second merged data, based on at least a portion of the output control signals.

20 Claims, 23 Drawing Sheets

(58) Field of Classification Search
CPC ..... G11C 16/26; G11C 16/0483; G11C 16/32;
G06F 3/064; G06F 3/0659
See application file for complete search history.

(56) References Cited

U.S. PATENT DOCUMENTS

| 2023/0009065 A1* | 1/2023 | Yeh .................... G11C 11/4091 |
| 2023/0081623 A1 | 3/2023 | Hsu et al. |
| 2025/0077425 A1 | 3/2025 | Mun et al. |

FOREIGN PATENT DOCUMENTS

| KR | 1020090047975 A | 5/2009 |
| KR | 1020120098094 A | 9/2012 |
| KR | 1020210092302 A | 7/2021 |

* cited by examiner

Figure 2:
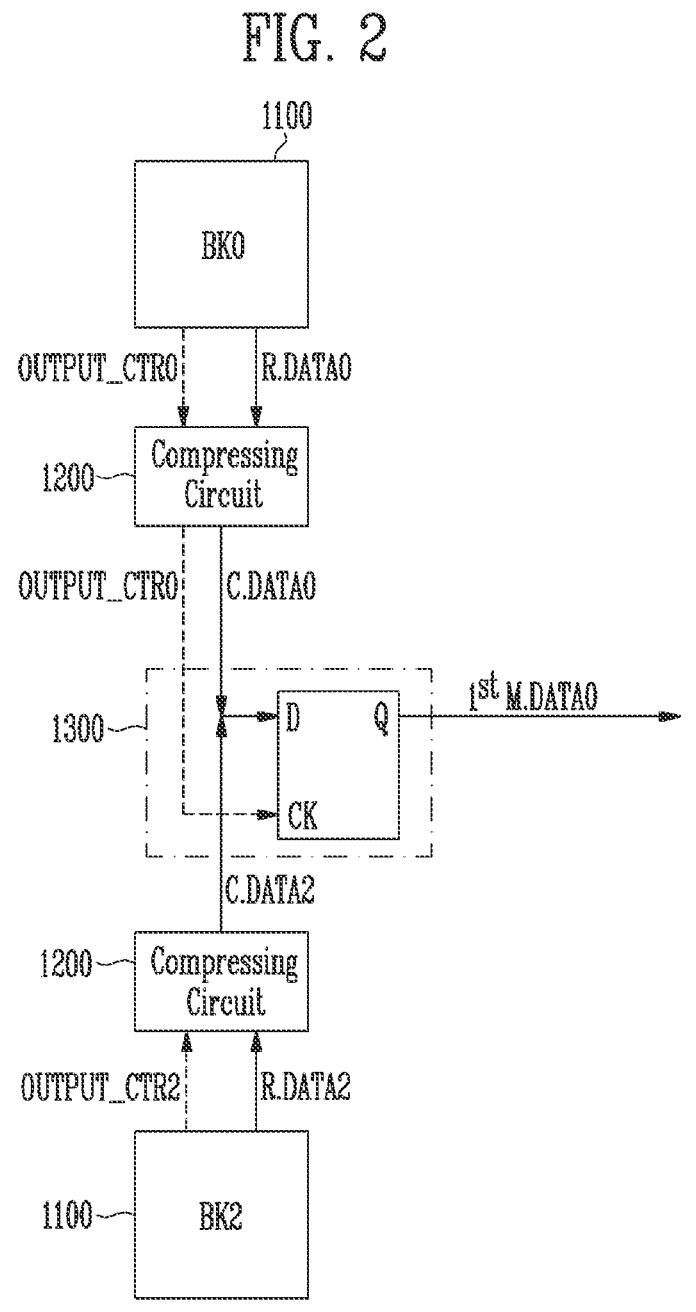

OUTPUT_CTR0          R.DATA0

1200          Compressing
              Circuit

OUTPUT_CTR0          C.DATA0

1300          D    Q          1st M.DATA0

CK

C.DATA2

1200          Compressing
              Circuit

OUTPUT_CTR2          R.DATA2

Figure 22:
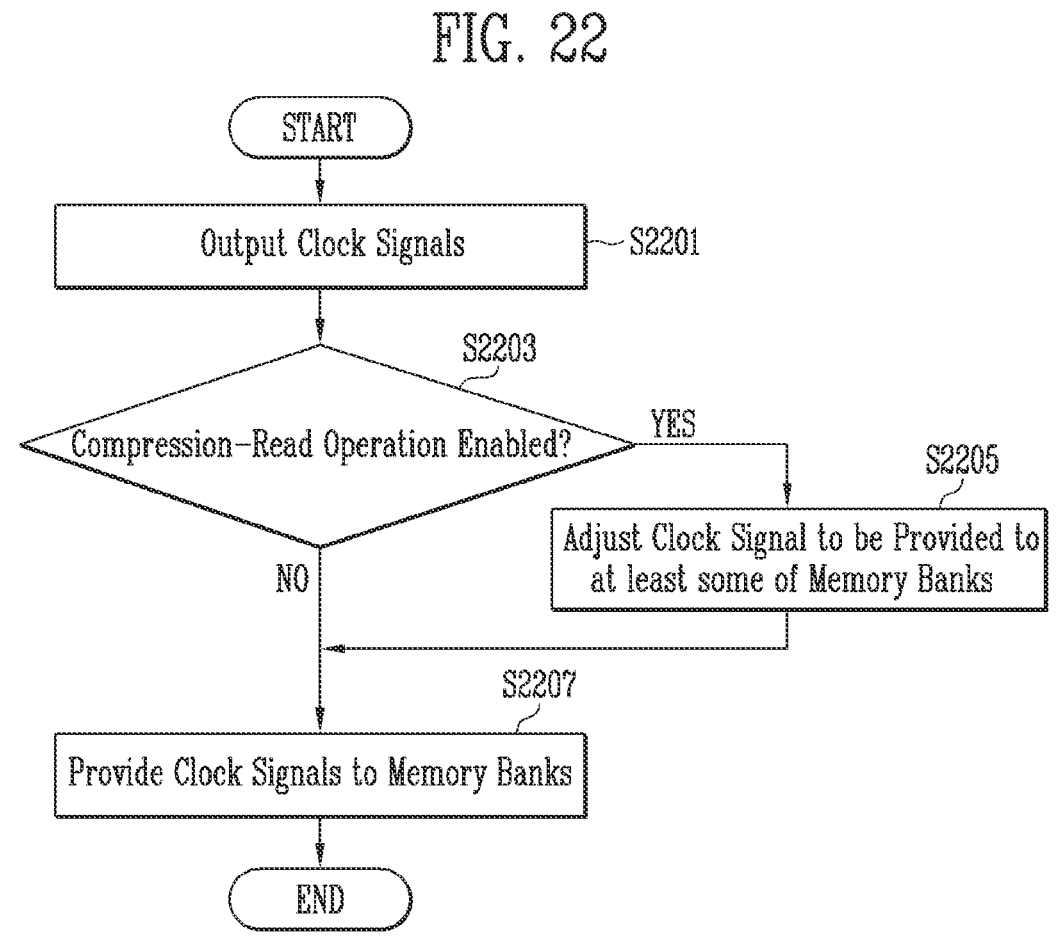

START

Output Clock Signals — S2201

S2203

Compression-Read Operation Enabled?

YES

S2205

Adjust Clock Signal to be Provided to at least some of Memory Banks

NO

S2207

Provide Clock Signals to Memory Banks

END

MEMORY DEVICE INCLUDING COMPRESSING AND MERGE CIRCUITS AND OPERATING METHOD OF THE MEMORY DEVICE

CROSS-REFERENCE TO RELATED APPLICATION

The present application claims priority under 35 U.S.C. § 119(a) to Korean patent application number 10-2023-0102845 filed on Aug. 7, 2023, in the Korean Intellectual Property Office, the entire disclosure of which is incorporated by reference herein.

BACKGROUND

1. Technical Field

The present disclosure generally relates to a memory device and an operating method of a memory device.

2. Related Art

Data read in a memory device may be transferred to an input/output pad through a data line. The number of data lines may be fixed to a predetermined number because of physical limitations. In general, a plurality of memory areas (memory banks) included in one or more memory devices may share and use a fixed number of data lines.

In general, an operation of sharing and using data lines may mean an operation in which a plurality of memory areas included in one or more memory devices monopolistically use a fixed number of data lines in a set order by a set time through time division.

However, in a specific operation mode such as a compression read operation, data read in each of a plurality of memory areas included in one or more memory devices may be compressed and output, and the plurality of memory areas included in the one or more memory devices may use a certain number of data lines obtained by dividing a fixed number of data lines for each of the plurality of memory areas. Accordingly, the plurality of memory areas included in the one or more memory devices may be simultaneously used. For example, when data read in each of four memory devices is compressed by ¼ and then output, each of the four memory devices uses two data lines obtained by dividing eight data lines for each of the four memory devices. Therefore, the four memory devices may be simultaneously used.

SUMMARY

In accordance with an embodiment of the present disclosure, a memory device includes: a plurality of memory planes each including a plurality of memory banks, the plurality of memory planes being grouped into memory planes sharing at least one peripheral circuit to constitute one or more plane groups; a plurality of compressing circuits respectively connected to the plurality of memory banks, the plurality of compressing circuits configured to output compressed data by respectively compressing data read from the plurality of memory banks in a compression read operation; a plurality of first merge circuits configured to receive the compressed data and output control signals corresponding to at least a portion of the memory banks, the plurality of first merge circuits configured to output first merged data obtained by merging compressed data corresponding to memory banks grouped as a first merge group, based on the output control signals; a second merge circuit configured to receive the first merged data from the first merge circuits, the second merge circuit configured to output second merged data obtained by merging first merged data generated from memory banks included in the same plane group; and an output buffer circuit configured to latch the second merged data, the output buffer circuit configured to output the second merged data, based on at least a portion of the output control signals.

In accordance with another embodiment of the present disclosure, a method of operating a memory device includes: generating compressed data obtained by respectively compressing data read from a plurality of memory banks respectively included in a plurality of memory planes; performing first merging on compressed data respectively corresponding to memory banks grouped as a first merge group, based on output control signals corresponding to at least a portion of the memory banks; performing second merging on first merged data respectively generated from memory banks included in the same second merge group among first merged data obtained by performing the first merging; and outputting second merged data obtained by performing the second merging, based on at least a portion of the output control signals, wherein the plurality of memory planes are grouped into memory planes sharing at least one peripheral circuit to constitute one or more plane groups, and wherein the second merge group is grouped into memory banks included in the same plane group.

BRIEF DESCRIPTION OF THE DRAWINGS

Example embodiments will now be described more fully hereinafter with reference to the accompanying drawings; however, embodiments may be embodied in different forms and should not be construed as limited to the embodiments set forth herein. Rather, example embodiments are provided so that this disclosure will be enabling to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 2 is a diagram illustrating a first merge circuit shown in FIG. 1.

FIG. 6 is a diagram illustrating another embodiment in which the clock signal is provided through the clock signal generator and the clock signal adjuster, which are shown in FIG. 4.

FIG. 22 is a flowchart illustrating a process of providing a clock signal to each of memory banks in the operating method of the memory device in accordance with an embodiment of the present disclosure.

DETAILED DESCRIPTION

The specific structural and functional descriptions disclosed herein are merely illustrative for the purpose of describing embodiments according to the concept of the present disclosure. Embodiments according to the concept of the present disclosure can be implemented in various forms, and should not be construed as limited to the embodiments set forth herein.

Some embodiments are directed to a memory device and an operating method of a memory device, which can reduce or prevent a merge failure which may occur in a merge process of data when a compression read operation is performed.

Figure 1:
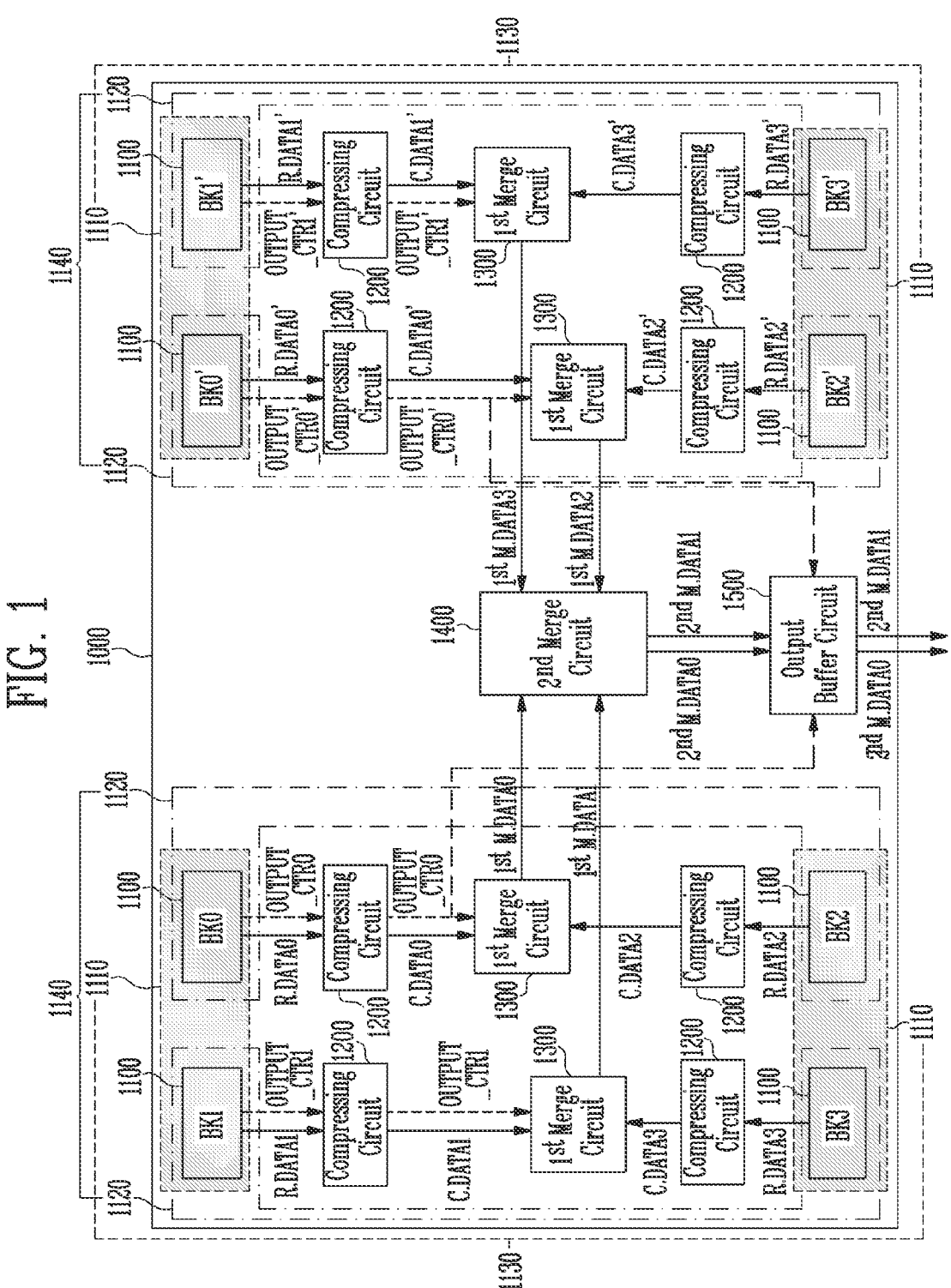
FIG. 1 is a diagram illustrating a memory device in accordance with an embodiment of the present disclosure.

FIG. 1 is a diagram illustrating a memory device in accordance with an embodiment of the present disclosure.

Referring to FIG. 1, the memory device 1000 may include a plurality of memory banks 1100. Each of the memory banks 1100 may include a plurality of memory blocks. Each of the plurality of memory blocks may include a plurality of memory cells. In an embodiment, the plurality of memory cells may be nonvolatile memory cells. Memory cells connected to the same word line may be defined as one page. Therefore, one memory block may include a plurality of pages.

In an embodiment, the memory banks 1100 may be memory areas included in different memory devices, respectively. In another embodiment, the memory banks 1100 may be different memory areas divided in one memory device.

In FIG. 1, it is illustrated that 8 memory banks 1100 BK0 to BK3 and BK0' to BK3' are included in the memory device 1000. However, the number of memory banks 1100 is not limited thereto. For example, the number of memory banks 1100 may be two or more, and be fewer or greater than 8 shown in FIG. 1. In another example, the number of memory banks 1100 may be 16 or 32.

In an embodiment, a plurality of memory banks 1100 may be included in a memory plane 1110. For example, bank 0 and bank 1 BK0 and BK1 may be included in a zeroth plane, bank 2 and bank 3 BK2 and BK3 may be included in a first memory plane, bank 0' and bank 1' BK0' and BK1' may be included in a second memory plane, and bank 2' and bank 3' BK2' and BK3' may be included in a third memory plane.

Among the memory planes 1110, memory planes 1110 sharing at least one peripheral circuit may be grouped to constitute at least one plane group 1130. For example, the zeroth memory plane 1110 including the bank 0 and the bank 1 BK0 and BK1 and the first memory plane 1110 including the bank 2 and the bank 3 BK2 and BK3 may share a peripheral circuit, and accordingly, the zeroth memory plane and the first memory plane may be grouped as a zeroth plane group 1130. In addition, the second memory plane 1110 including the bank 0' and the bank 1' BK0' and BK1' and the third memory plane 1110 including the bank 2' and the bank 3' BK2' and BK3' may share a peripheral circuit, and accordingly, the second memory plane and the third memory plane may be grouped as a first plane group 1130.

In an embodiment, memory banks 1100 physically adjacent to each other may be grouped to constitute a first merge group 1120. Data output from memory banks 1100 included in one first merge group 1120 may be merged as first merged data $1^{st}$ M.DATA. In an embodiment, memory banks 1100 physically adjacent to each other may be grouped to constitute a first merge group 1120. In an embodiment, memory banks 1100 which are included in the same plane group 1130 and are included in different memory planes 1110 may be grouped to constitute a first merge group 1120. In an embodiment, each of the plane groups 1130 may include a plurality of first merge groups 1120.

In an embodiment, memory banks 1100 physically adjacent to each other may be grouped to constitute a second merge group 1140. More specifically, first merge groups 1120 physically adjacent to each other may be grouped to constitute a second merge group 1140. Data output from memory banks 1100 included in one second merge group 1140 may be merged as a second merged data $2^{nd}$ M.DATA. In an embodiment, the second merge group 1140 may be configured with memory banks 1100 included in the same plane group 1130, and each of the plane groups 1130 may include at least one second merge group 1140. In an embodiment, as shown in FIG. 1, as one plane group 1130 is included in one second merge group 1140, the plane group 1130 and the second merge group 1140 may be the same, but the present disclosure is not limited thereto. In another embodiment, one plane group 1130 may include two or more second merge groups 1140. In an embodiment, memory banks 1100 included in one first merge group 1120 are included in the same second merge group 1140, but may be included in different memory planes 1110.

In this specification, memory banks 1100 physically adjacent to each other may be determined with respect to only a relative distance between the memory banks 1100, under an assumption in which memory banks 1100 included in one plane group 1130 are consecutively disposed. That is, in FIG. 1, it is illustrated that compressing circuits 1200, first merge circuits 1300, and the like are located between memory planes 1110 in one plane group 1130. However, because a peripheral circuit including compressing circuits 1200 and first merge circuits 1300 may be located on a plane different from a plane on which memory banks 1100 are located, the peripheral circuit might not be considered when it is determined whether the memory banks 1100 are adjacent to each other. For example, in FIG. 1, compressing circuits 1200 and first merge circuits 1300 between the memory bank 0 BK0 and the memory bank 2 BK2 may be located on a plane different from a plane on which the memory banks 1100 are located. Hence, when it is determined whether the memory banks 1100 adjacent to each other except the compressing circuits 1200 and the first merge circuits 1300, the memory bank 0 BK0 and the memory bank 2 BK2 may be memory banks 1100 adjacent to each other. Identically, the memory bank 0' BK0' and the memory bank 2' BK2', the memory bank 1 BK1 and the memory bank 3 BK3, and the memory bank 1' BK1' and the memory bank 3' BK3' may be memory banks 1100 adjacent to each other.

A compressing circuit 1200 may be connected to each of the memory banks 1100. The compressing circuit 1200 may be enabled when the memory device 1000 performs a compression read operation. In an embodiment, the memory device 1000 may perform the compression read operation, based on a command received from outside the memory device 1000. In another embodiment, the memory device 1000 may perform the compression read operation, based on its own decision.

When the compression read operation is performed, first, read data R.DATA may be output from each of the memory banks 1100. The read data R.DATA may be output in response to an output control signal OUTPUT_CTR. The output control signal OUTPUT_CTR may be generated based on a supplied clock signal. The clock signal may be provided from outside the memory device 1000 or be provided from a power source in the memory device 1000. Although only output control signals OUTPUT_CTR0, OUTPUT_CTR1, OUTPUT_CTR0', and OUTPUT_CTR1' output from the bank 0 BK0, the bank 1 BK1, the bank 0' BK0', and the bank 1' BK1' are illustrated in FIG. 1, the present disclosure is not limited thereto, and all the memory banks 1100 may respectively output output control signals OUTPUT_CTR.

After that, the read data R.DATA read from each of the memory banks 1100 may be compressed in a compressing circuit 1200 connected to each of the memory banks 1100, and accordingly, compressed data C.DATA may be output from the compressing circuit 1200. The compressed data C.DATA may also be output in response to the output control signal OUTPUT_CTR.

The compressing circuit 1200 may compress the read data R.DATA at a compression ratio of 1:N, thereby generating the compressed data C.DATA. Here, N may be a natural number of 2 or more. For example, when assuming that N is 4, the compressing circuit 1200 may compress the read data R.DATA at a compression ratio of 1:4, i.e., 25%, thereby generating the compressed data C.DATA. For example, when the read data R.DATA is 16 bits, the 4-bit compressed data C.DATA may be output from the compressing circuit 1200.

Compressed data C.DATA output from the compressing circuits 1200 may be merged in a first merge circuit 1300. The first merge circuit 1300 may merge compressed data C.DATA corresponding to different memory banks 1100. More specifically, the first merge circuit 1300 may merge compressed data C.DATA corresponding to memory banks 1100 included in the same first merge group 1120. For example, as shown in FIG. 1, the bank 0 BK0 and the bank 2 BK2 may be included in one first merge group 1120, and C.DATA0 as compressed data corresponding to the bank 0 BK0 and C.DATA2 as compressed data corresponding to the bank 2 BK2 may be merged in the first merge circuit 1300. Identically, C.DATA1 as compressed data corresponding to the bank 1 BK1 and C.DATA3 as compressed data corresponding to the bank 3 BK3, C.DATA0' as compressed data corresponding to the bank 0' BK0' and C.DATA2' as compressed data corresponding to the bank 2' BK2', and C.DATA1' as compressed data corresponding to the bank 1' BK1' and C.DATA3' as compressed data corresponding to the bank 3' BK3' may be merged in first merge circuits 1300, respectively. That is, the first merge circuits 1300 may generate first merged data $1^{st}$ M.DATA respectively corresponding to the first merge groups 1120.

In an embodiment, the first merge circuit 1300 may receive compressed data C.DATA and an output control signal OUTPUT_CTR, which correspond to the memory banks 1100 in the first merge group 1120, and merge the compressed data C.DATA corresponding to the memory banks 1100 in the first merge group 1120, using the output control signal OUTPUT_CTR. In an embodiment, the first merge circuit 1300 may latch the compressed data C.DATA corresponding to the memory banks 1100 in the first merge group 1120, and output the latched compressed data C.DATA, based on the output control signal OUTPUT_CTR, thereby outputting first merged data $1^{st}$ M.DATA obtained by merging the compressed data C.DATA corresponding to the memory banks 1100 in the first merge group 1120.

The first merge circuit 1300 may select and use any one output control signal OUTPUT_CTR among a plurality of output control signals OUTPUT_CTR output from the memory banks 1100 in the first merge group 1120. For example, when C.DATA0 and C.DATA2 are merged by the first merge circuit 1300, the first merge circuit 1300 may select and use output control signal 0 OUTPUT_CTR0 output from the bank 0 BK0 and output control signal 2 (not shown) output from the bank 2 BK2. Accordingly, first merged data 0 $1^{st}$ M.DATA0 may be output in response to the output control signal 0 OUTPUT_CTR0. The method of selecting the output control signal OUTPUT_CTR is not limited to a specific example.

First merged data $1^{st}$ M.DATA output from the first merge circuits 1300 may be merged in a second merge circuit 1400. The second merge circuit 1400 may merge first merged data $1^{st}$ M.DATA output from different first merge circuits 1300. More specifically, the second merge circuit 1400 may merge first merged data $1^{st}$ M.DATA generated from memory banks 1100 included in the same second merge group 1140. That is, the second merge circuit 1400 may merge first merged data $1^{st}$ M.DATA respectively corresponding to memory banks 1100 included in the same second merge group 1140. For example, first merged data 0 $1^{st}$ M.DATA0 and first merged data 1 $1^{st}$ M.DATA1 may be merged in the second merge circuit 1400. In another example, the first merged data 0 $1^{st}$ M.DATA0 and first merged data 3 $1^{st}$ M.DATA3 may be merged in the second merge circuit 1400. In an embodiment, first merged data $1^{st}$ M.DATA generated from the same plane group 1130, more specifically, first merged data $1^{st}$ M.DATA respectively corresponding to first merge groups 1120 included in the same second merge group 1140 may be merged in the second merge circuit 1400, and the number of first merge groups 1120 corresponding to the first merged data merged in the second merge circuit 1400 is not limited to a specific example.

The second merge circuit 1400 may merge the first merged data $1^{st}$ M.DATA, thereby outputting second merged data $2^{nd}$ M.DATA. The output second merged data $2^{nd}$ M.DATA may be latched to an output buffer circuit 1500. The second merged data $2^{nd}$ M.DATA latched to the output buffer circuit 1500 may be output based on an output control signal OUTPUT_CTR. The output buffer circuit 1500 may select any one of output control signals OUTPUT_CTR respectively corresponding to the second merge groups 1140, and output the second merged data $2^{nd}$ M.DATA in response to the selected output control signal OUTPUT_CTR. For example, when assuming that second merged data 0 $2^{nd}$ M.DATA0 is obtained by merging the first merged data 0 $1^{st}$ M.DATA0 and the first merged data 1 $1^{st}$ M.DATA1, the output buffer circuit 1500 may select and use the output control signal 0 OUTPUT_CTR0 from the output control signal 0 OUTPUT_CTR0 and output control signal 1 OUTPUT_CTR1. Accordingly, the second merged data 0 $2^{nd}$ M.DATA0 may be output from the output buffer circuit 1500 in response to the output control signal 0 OUTPUT_CTR0.

Output control signals OUTPUT_CTR may be output from the memory banks 1100. The output control signals OUTPUT_CTR may be used for outputting and merging of data. For example, the memory banks 1100, the compressing circuits 1200, and the like may output read data R.DATA or compressed data C.DATA in response to an output control signal OUTPUT_CTR. In addition, the first merge circuit 1300, the output buffer circuit 1500, and the like may align and output latched data in response to an output control signal OUTPUT_CTR, so that the output control signal OUTPUT_CTR is used for merging data.

FIG. 2 is a diagram illustrating the first merge circuit shown in FIG. 1.

Referring to FIGS. 1 and 2, the bank 0 BK0 and the bank 2 BK2 may be memory banks 1100 included in the same first merge group 1120. Read data 0 R.DATA0 read from the bank 0 BK0 may be compressed by a compressing circuit 1200, and compressed data 0 C.DATA0 may be output from the compressing circuit 1200. In addition, read data 2 R.DATA2 read from the bank 2 BK2 may be compressed by a compressing circuit 1200, and compressed data 2 C.DATA2 may be output from the compressing circuit 1200.

An output control signal OUTPUT_CTR may be output together with read data R.DATA from each of the memory banks 1100, and the read data R.DATA may be output from each of the memory banks 1100 in response to the output control signal OUTPUT_CTR. Therefore, the read data 0 R.DATA0 may be output in response to output control signal 0 OUTPUT_CTR0, and the read data 2 R.DATA2 may be output in response to output control signal 2 OUTPUT_CTR2.

The compressed data 0 C.DATA0 and the compressed data 2 C.DATA2 may be merged by a first merge circuit 1300. In an embodiment, the first merge circuit 1300 may include a D flip-flop. The compressed data 0 C.DATA0 and the compressed data 2 C.DATA2 may be input to the D flip-flop to be latched. In an embodiment, the first merge circuit 1300 may include D flip-flops having a number corresponding to bit numbers of data read from the memory bank 1100, but the present disclosure is not limited thereto. For example, when assuming that 16-bit data is read from the memory bank 1100, the first merge circuit 1300 may include 16 flip-flops. In a normal read operation, 16-bit data may be read from the memory bank 1100 to be latched to the 16 flop-flops as it is. In the compression read operation, when read data R.DATA is compressed at a compression ratio of 1:2, i.e., 50% by the compressing circuit 1200, the 8-bit compressed data 0 C.DATA0 compressed and output in the bank 0 BK0 and the 8-bit compressed data 2 C.DATA2 compressed and output in the bank 2 BK2 may be divided to be latched to the 16 flip-flops. When read data R. DATA is compressed at a compression ratio of 1:4, i.e., 25% by the compressing circuit 1200, the 4-bit compressed data 0 C.DATA0 compressed and output in the bank 0 BK0 and the 4-bit compressed data 2 C.DATA2 compressed and output in the bank 2 BK2 may be divided to be latched to 8 flip-flops among the 16 flip-flops, and the other 8 flip-flops might not be used.

The latched compressed data 0 C.DATA0 and the latched compressed data 1 C.DATA1 may be aligned and output by an output control signal OUTPUT_CTR input to the D flip-flop, so that first merged data 0 $1^{st}$ M.DATA0 is output. In FIG. 2, it is illustrated that the output control signal 0 OUTPUT_CTR0 is used as a clock signal input to the D flip-flop. However, the present disclosure is not limited thereto, and the clock signal input to the D flip-flop may be selected from the output control signal 0 OUTPUT_CTR0 and the output control signal 2 OUTPUT_CTR2. Accordingly, in an embodiment, the first merge circuit 1300 may further include a signal selector for selecting the clock signal input to the D flip-flop.

Figure 3:
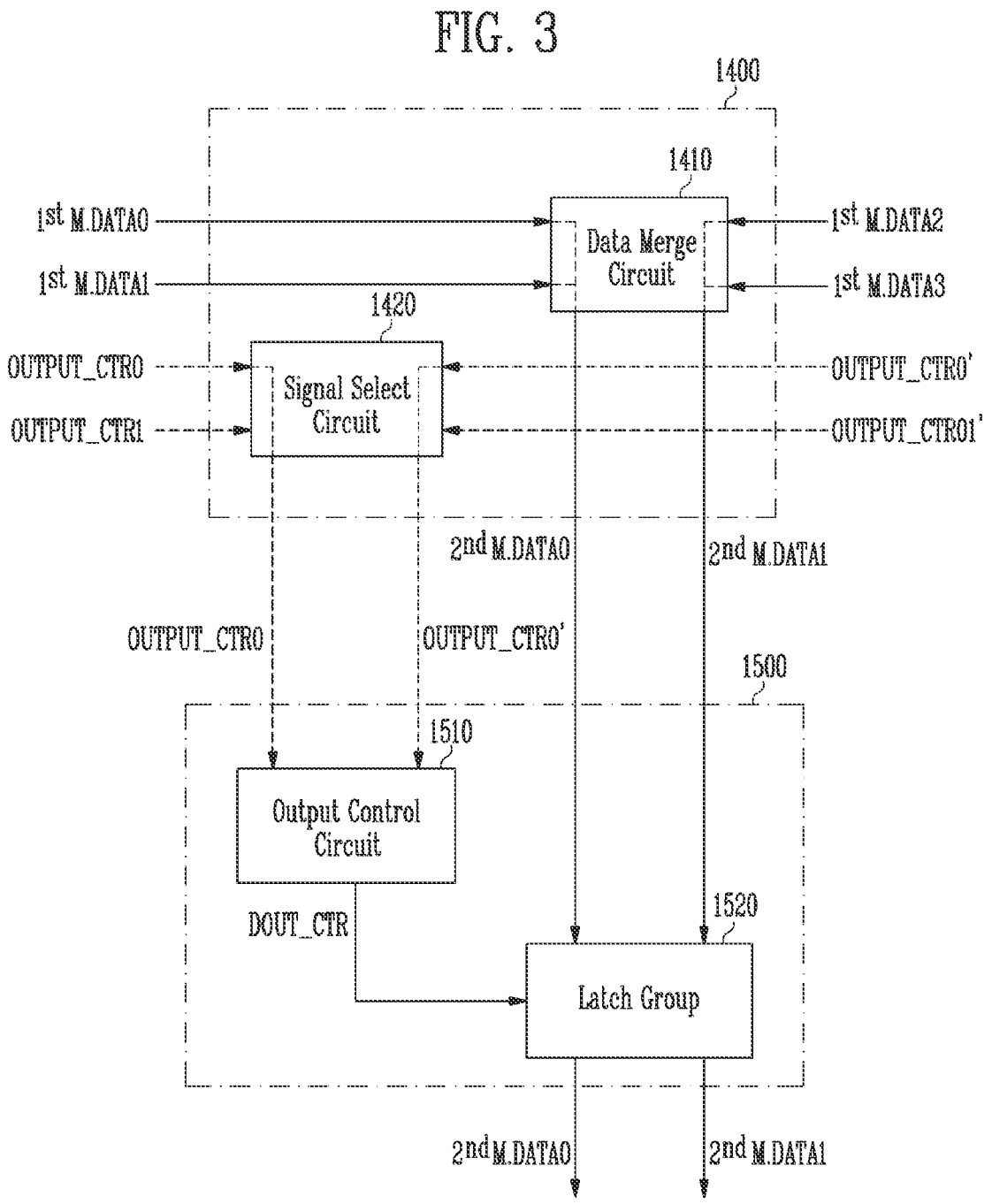
FIG. 3 is a diagram illustrating a second merge circuit and an output buffer circuit, which are shown in FIG. 1.

FIG. 3 is a diagram illustrating the second merge circuit and the output buffer circuit, which are shown in FIG. 1.

Referring to FIGS. 1 and 3, the second merge circuit 1400 may include a data merge circuit 1410 and a signal select circuit 1420.

The data merge circuit 1410 may receive and merge first merged data $1^{st}$ M.DATA output from a plurality of first merge circuits 1300. In an embodiment, the data merge circuit 1410 may merge first merged data $1^{st}$ M.DATA generated from memory banks 1100 included in the same second merge group 1140. That is, the data merge circuit 1410 may merge first merged data $1^{st}$ M.DATA respectively corresponding to first merge groups 1120 included in the same second merge group 1140. For example, the data merge circuit 1410 may merge first merged data 0 $1^{st}$ M.DATA0 and first merged data 1 $1^{st}$ M.DATA1, thereby outputting second merged data 0 $2^{nd}$ M.DATA0, and merge first merged data 2 $1^{st}$ M.DATA2 and first merged data 3 $1^{st}$ M.DATA3, thereby outputting second merged data 1 $2^{nd}$ M.DATA1.

In an embodiment, the data merge circuit 1410 may include one or more multiplexing circuits, and first merged data $1^{st}$ M.DATA input to the data merge circuit 1410 may be merged by the multiplexing circuits to be output as second merged data $2^{nd}$ M.DATA.

The signal select circuit 1420 may receive output control signals OUTPUT_CTR output from memory banks 1100. When a memory device 1000 performs a compression read operation, the signal select circuit 1420 may select and output a portion of the received output control signals OUTPUT_CTR. In an embodiment, the signal select circuit 1420 may select one of output control signals OUT- PUT_CTR corresponding to the first merged data $1^{st}$ M.DATA merged by the data merge circuit 1410.

For example, as shown in FIG. 3, the data merge circuit 1410 may merge the first merged data 0 $1^{st}$ M.DATA0 and the first merged data $1^{st}$ M.DATA1, thereby outputting the second merged data 0 $2^{nd}$ M.DATA0, and merge the first merged data 2 $1^{st}$ M.DATA2 and the first merged data 3 $1^{st}$ M.DATA3, thereby outputting the second merged data 1 $2^{nd}$ M.DATA1. The first merged data 0 to 3 $1^{st}$ M.DATA0 to $1^{st}$ M.DATA3 may be output from the first merge circuits 1300 in response to output control signals 0, 0', 1, and 1' OUTPUT_CTR0, OUTPUT_CTR0', OUTPUT_CTR1, and OUTPUT_CTR1', respectively.

The signal select circuit 1420 may receive the output control signals 0, 0', 1, and 1' OUTPUT_CTR0, OUTPUT_CTR0', OUTPUT_CTR1, and OUTPUT_CTR1'. In an embodiment, the signal select circuit 1420 may select and output any one of the output control signal 0 OUTPUT_CTR0 and the output control signal 1 OUTPUT_CTR1, and select and output any one of the output control signal 0' OUTPUT_CTR0' and the output control signal 1' OUTPUT_CTR1'. For example, as shown in FIG. 3, the output control signal 0 OUTPUT_CTR0 may be selected from the output control signal 0 OUTPUT_CTR0 and the output control signal 1 OUTPUT_CTR1, and the output control signal 0' OUTPUT_CTR0' may be selected from the output control signal 0' OUTPUT_CTR0' and the output control signal 1' OUTPUT_CTR1'.

When the memory device 1000 performs the normal read operation, the signal select circuit 1420 does not simultaneously receive the output control signal 0 OUTPUT_CTR0 and the output control signal 1 OUTPUT_CTR1 or the output control signal 0' OUTPUT_CTR0' and the output control signal 1' OUTPUT_CTR1'. Hence, the signal select circuit 1420 may output a receive output control signal OUTPUT_CTR as it is. In addition, although not shown in FIG. 3, the signal select circuit 1420 may further receive output control signals OUTPUT_CTR output from the memory banks 2, 2, 3, and 3.

The second merged data $2^{nd}$ M.DATA merged and output by the data merge circuit 1410 and the output control signal OUTPUT_CTR selected by the signal select circuit 1420 may be provided to the output buffer circuit 1500. The output buffer circuit 1500 may include an output control circuit 1510 and a latch group 1520.

The latch group 1520 may include a plurality of latches, and the second merged data $2^{nd}$ M.DATA output from the second merge circuit 1400 may be latched to the plurality of latches. The output control circuit 1510 may provide a data-out control signal DOUT_CTR to the latch group 1520, based on the output control signals OUTPUT_CTR received from the second merge circuit 1400. More specifically, the output control circuit 1510 may provide the data-out control signal DOUT_CTR to the latch group 1520, based on the output control signals OUTPUT_CTR selected by the signal select circuit 1420. The second merged data $2^{nd}$ M.DATA latched to the latch group 1520 may be output in response to the data-out control signal DOUT_CTR.

Figure 4:
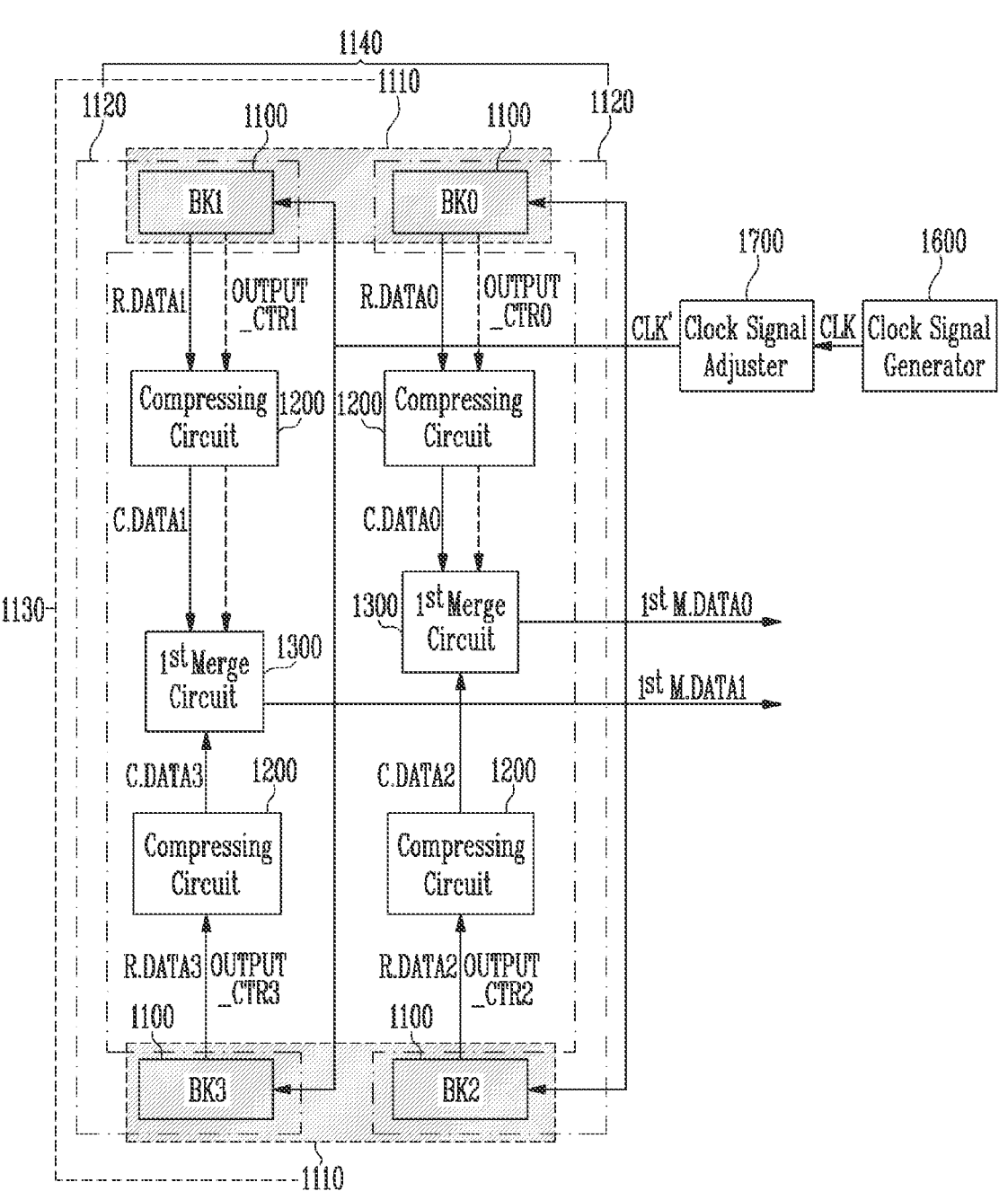
FIG. 4 is a diagram illustrating a clock signal generator and a clock signal adjuster, which provide a clock signal to the memory device shown in FIG. 1.

FIG. 4 is a diagram illustrating a clock signal generator and a clock signal adjuster, which provide a clock signal to the memory device shown in FIG. 1.

Referring to FIGS. 1 and 4, the memory device 1000 may further include a clock signal generator 1600 and a clock signal adjuster 1700. The clock signal generator 1600 may output clock signals CLK to be provided to memory banks 1100. In an embodiment, the clock signal generator 1600 may generate clock signals by using an internal power source of the memory device 1000 or a power source outside of the memory device 1000. In another embodiment, the clock signal generator 1600 may provide clock signals provided from outside the memory device 1000 to memory banks 1100. In FIG. 4, for convenience of description, it is illustrated that clock signals CLK are provided to one plane group 1130. However, clock signals CLK may be provided to all the plane groups 1130 included in the memory device 1000. In an embodiment, a clock signal CLK provided to all the plane groups 1130 may be the same clock signal CLK output from the same clock signal generator 1600. In another embodiment, clock signals CLK provided to different plane groups 1130 may be clock signals CLK respectively output from different clock signal generators 1600.

The clock signal adjuster 1700 may adjust a clock signal CLK output from the clock signal generator 1600 and provide an adjusted clock signal CLK' to at least a portion of the memory banks 1100.

Each of the memory banks 1100 may generate an output control signal OUTPUT_CTR, based on the received clock signals CLK and CLK', and output the output control signal OUTPUT_CTR together with read data R.DATA. When the clock signal CLK output from the clock signal generator 1600 is provided to each of the memory banks 1100, a phase difference between input clock signals occurs according to a physical distance difference between paths from the clock signal generator 1600 to the respective memory banks 1100, and accordingly, a phase difference occurs between output control signals OUTPUT_CTR output from the respective memory banks 1100. When the phase difference between the output control signals OUTPUT_CTR is excessive, a failure may occur when data are merged, and therefore, the clock signal adjuster 1700 may adjust at least a portion of the clock signals CLK provided to the memory banks 1100 to reduce the phase difference between the output control signals OUTPUT_CTR. Accordingly, the clock signal adjuster 1700 may provide the adjusted clock signal CLK' to the memory banks 1000.

In an embodiment, the clock signal adjuster 1700 may adjust a clock signal according to whether the compression read operation is enabled. For example, when the compression read operation is not enabled, i.e., when the normal read operation is being performed, the clock signal adjuster 1700 may provide the memory banks 1100 with a clock signal CLK output from the clock signal generator 1600 as it is. When the compression read operation is enabled, the clock signal adjuster 1700 may adjust the clock signal CLK output from the clock signal generator 1600 and provide the adjusted clock signal to the memory banks 1100 to perform the compression read operation. Therefore, the clock signal adjuster 1700 may receive a compression read enable signal indicating whether the compression read operation is enabled, and adjust the clock signal, based on the compression read enable signal.

Figure 5:
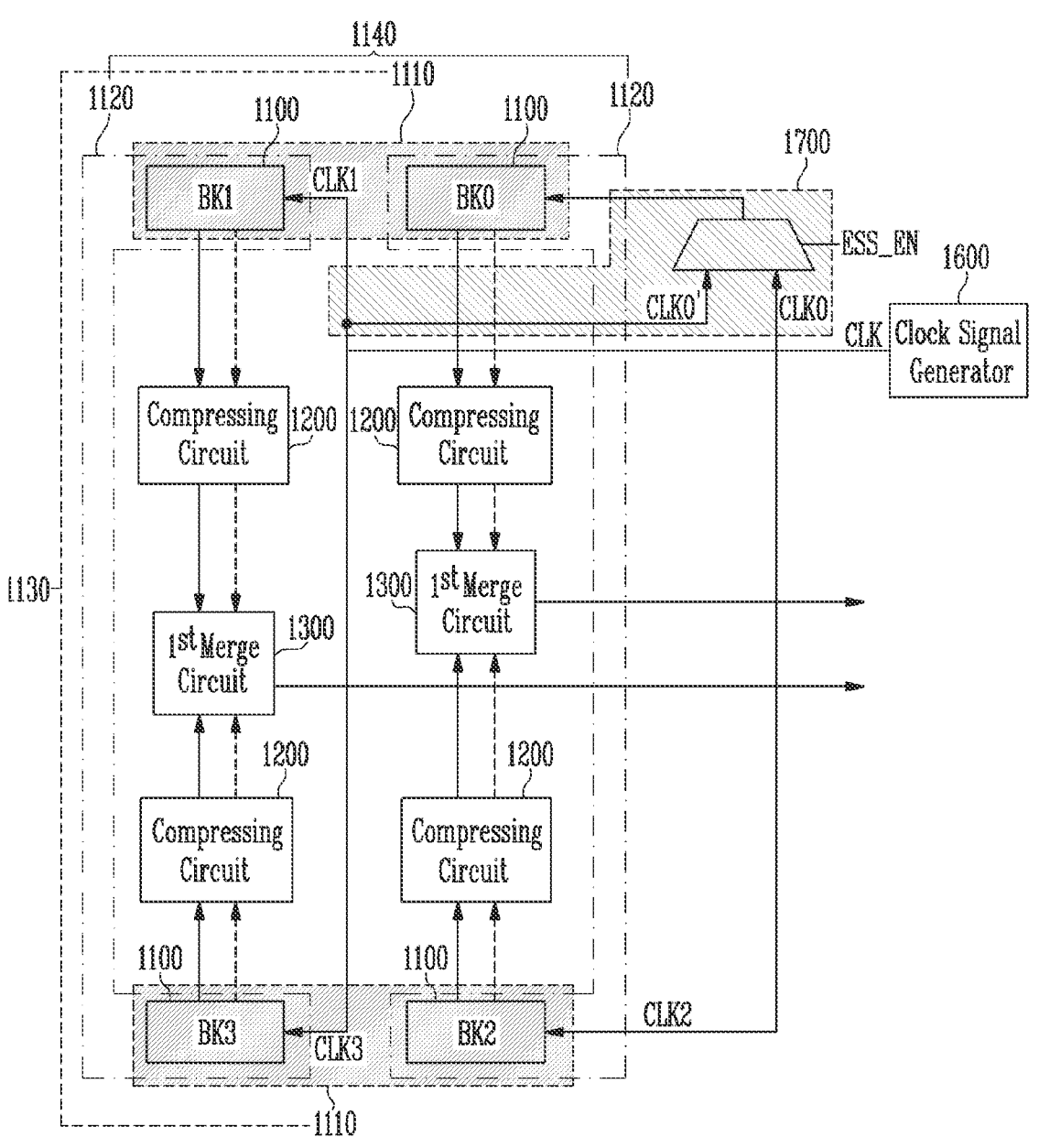
FIG. 5 is a diagram illustrating an embodiment in which a clock signal is provided through the clock signal generator and the clock signal adjuster, which are shown in FIG. 4.

FIG. 5 is a diagram illustrating an embodiment in which a clock signal is provided through the clock signal generator and the clock signal adjuster, which are shown in FIG. 4.

Referring to FIGS. 4 and 5, the clock signal adjuster 1700 may adjust a clock signal provided to the memory bank 0 BK0 among the plurality of memory banks 1100, based on a compression read mode enable signal ESS_EN. For example, when the compression read mode enable signal ESS_EN indicates that the compression read operation has not been enabled, a clock signal CLK0 output from the clock signal generator 1600 may be provided as it is to the memory bank 0 BK0. When the compression read mode enable signal ESS_EN indicates that the compression read operation has been enabled, a clock signal CLK0' adjusted by the clock signal adjuster 1700 may be provided to the memory bank 0 BK0. In an embodiment, the clock signal adjuster 1700 may include a multiplexing circuit for selecting and outputting the clock signal CLK0 or the adjusted clock signal CLK0' according to the compression read mode enable signal ESS_EN.

In an embodiment, to delay the clock signal provided to the memory bank 0 BK0, a circuit in the clock signal adjuster 1700 may be designed such that the clock signal CLK output from the clock signal generator 1600 is provided to the memory bank 0 BK0 after passing through an additional path. For example, as shown in FIG. 5, the circuit in the clock signal adjuster 1700 may be designed such that the clock signal CLK0' output from the clock signal generator 1600 to be transferred in a direction toward the memory bank 1 BK1 and then returned in a direction toward the memory bank 0 BK0 is provided to the memory bank 0 BK0. Accordingly, the delayed clock signal CLK0' may be input to the multiplexing circuit, and the clock signal CLK0 or the delayed clock signal CLK0' may be provided to the memory bank 0 BK according to the compression read mode enable signal ESS_EN.

In FIG. 5, it is illustrated that only the clock signal provided to the memory bank 0 BK0 among the plurality of memory banks 1100 is adjusted. However, the present disclosure is not limited thereto, and the number and positions of memory banks 1100 to which the clock signal adjuster 1700 can provide the adjusted clock signal may be appropriately changed, if necessary.

Figure 6:
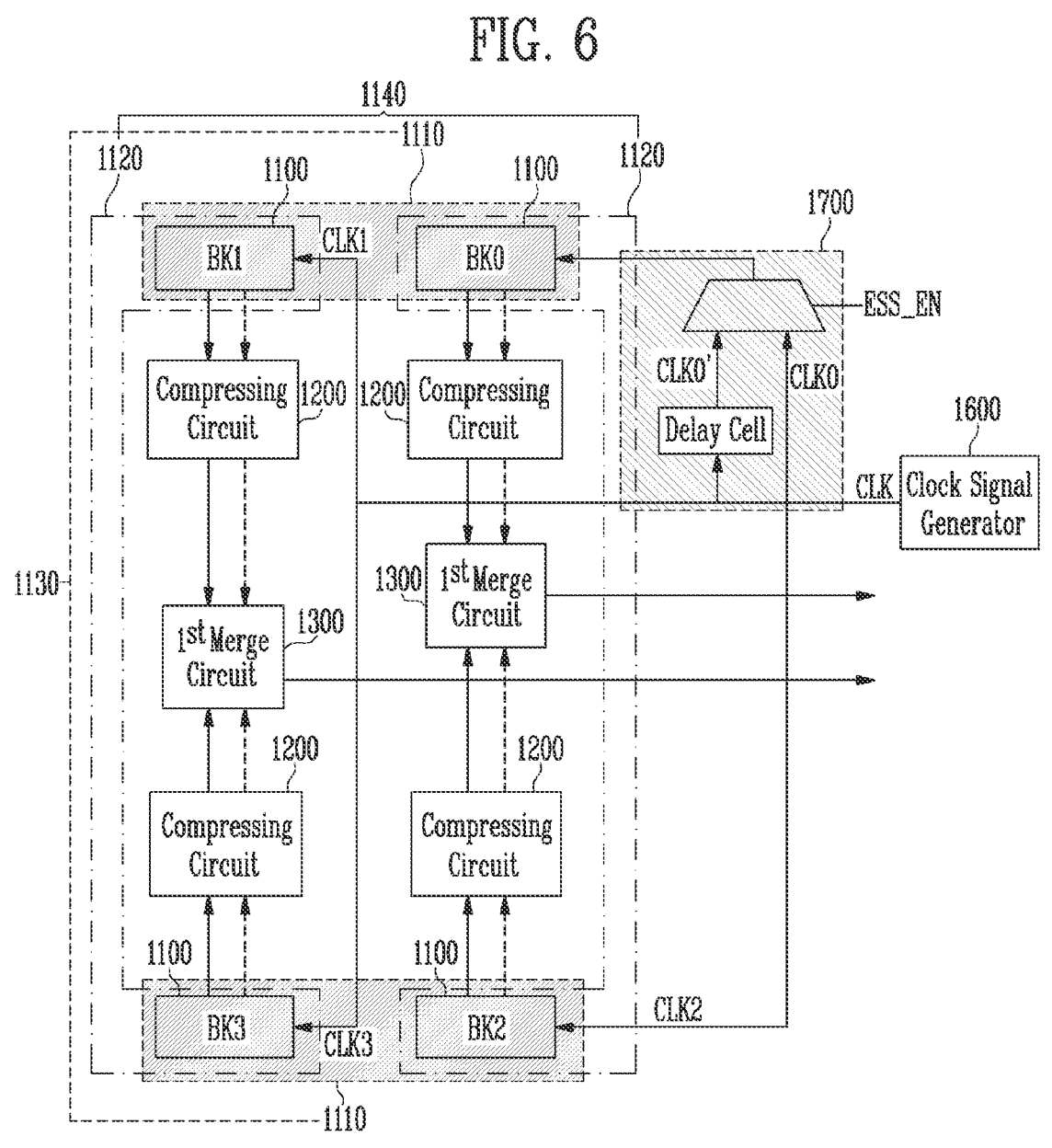

FIG. 6 is a diagram illustrating another embodiment in which the clock signal is provided through the clock signal generator and the clock signal adjuster, which are shown in FIG. 4.

Referring to FIGS. 4 and 6, the clock signal adjuster 1700 may adjust a clock signal provided to the memory bank 0 BK0 among the plurality of memory banks 1100, based on a compression read mode enable signal ESS_EN. For example, when the compression read mode enable signal ESS_EN indicates that the compression read operation has not been enabled, a clock signal CLK0 output from the clock signal generator 1600 may be provided as it is to the memory bank 0 BK0. When the compression read mode enable signal ESS_EN indicates that the compression read operation has been enabled, a clock signal CLK0' adjusted by the clock signal adjuster 1700 may be provided to the memory bank 0 BK0. In an embodiment, the clock signal adjuster 1700 may include a multiplexing circuit for selecting and outputting the clock signal CLK0 or the adjusted clock signal CLK0' according to the compression read mode enable signal ESS_EN.

In an embodiment, to delay the clock signal provided to the memory bank 0 BK0, the clock signal adjuster 1700 may include a delay cell. The delay cell may receive the clock signal CLK output from the clock signal generator 1600, delay the received clock signal CLK for a certain time, and then output the delayed clock signal. Accordingly, the delayed clock signal CLK0' may be input to the multiplexing circuit, and the clock signal CLK0 or the delayed clock signal CLK0' may be provided to the memory bank 0 BK according to the compression read mode enable signal ESS_EN.

In FIG. 6, it is illustrated that only the clock signal provided to the memory bank 0 BK0 among the plurality of memory banks 1100 is adjusted. However, the present disclosure is not limited thereto, and the number and positions of memory banks 1100 to which the clock signal adjuster 1700 can provide the adjusted clock signal may be appropriately changed, if necessary.

Figure 7:
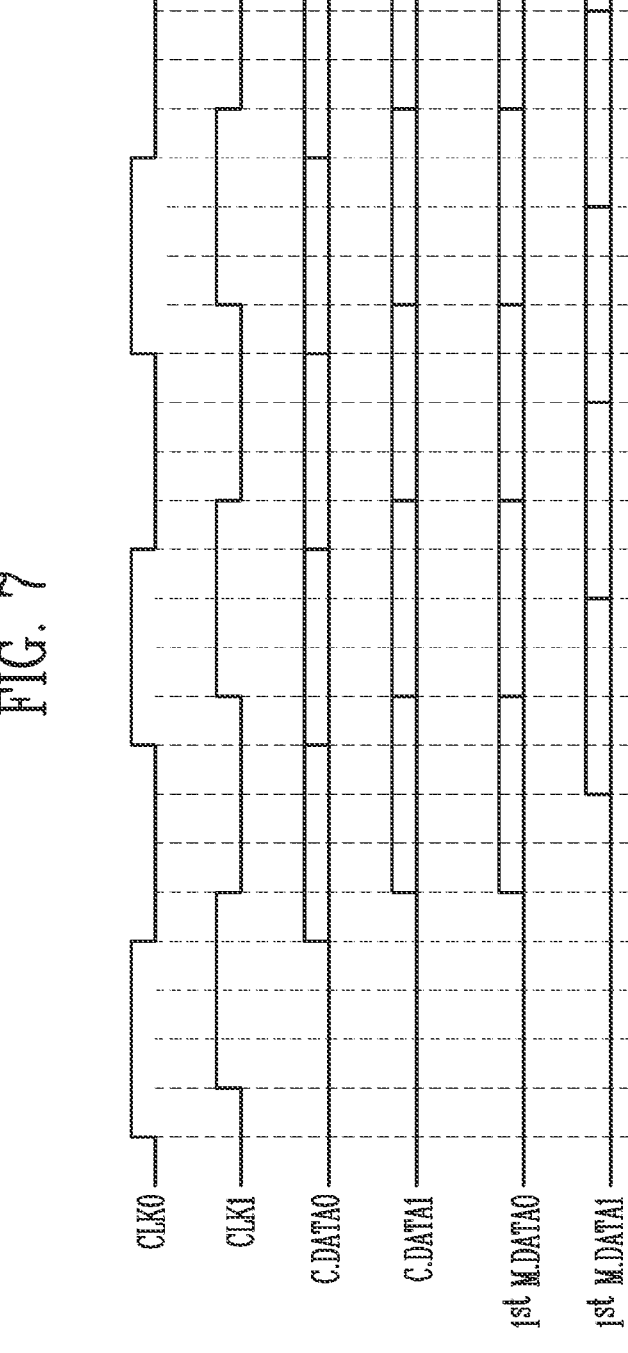
FIG. 7 is a timing diagram illustrating an output of data when an unadjusted clock signal is provided to the memory device in accordance with an embodiment of the present disclosure.

FIG. 7 is a timing diagram illustrating an output of data when an unadjusted clock signal is provided to the memory device in accordance with an embodiment of the present disclosure.

Referring to FIGS. 1, 4, and 7, clock signals 0 and 1 CLK0 and CLK1 may be respectively provided to the memory banks 0 and 1 BK0 and BK1, and the memory banks 0 and 1 BK0 and BK1 may generate output control signals OUTPUT_CTR0 and OUTPUT_CTR1, based on the clock signals 0 and 1 CLK0 and CLK1. Read data R.DATA0 and R.DATA1 output from the memory banks 0 and 1 BK0 and BK1 may be output to be synchronized with the output control signals OUTPUT_CTR0 and OUTPUT_CTR1, respectively, and compressed data C.DATA0 and C.DATA1 output from the compressing circuits 1200 connected to the memory banks 0 and 1 BK0 and BK1 may also be output to be synchronized with output control signals OUTPUT_CTR0 and OUTPUT_CTR1, respectively.

Although the same clock signal CLK output from the clock signal generator 1600 is provided to each of the memory banks 1100, phases of the clock signals CLK0 and CLK1 input to the respective memory banks 1100 may be different from each other according to a physical distance difference between paths from the clock signal generator 1600 to the respective memory banks 1100. Because the memory banks 1100 generate output control signals OUTPUT_CTR, based on the clock signals CLK0 and CLK1 input to the respective memory banks 1100, a phase difference occurs between the output control signals OUTPUT_CTR0 and OUTPUT_CTR1 output from the memory banks 1100, and accordingly, a difference also occurs between output timings of the compressed data C.DATA0 and C.DATA1. As a result, an output timing difference may occur between first merged data $1^{st}$ M.DATA0 and $1^{st}$ M.DATA1 respectively obtained by merging the compressed data. In particular, the output timing difference between the first merged data $1^{st}$ M.DATA0 and $1^{st}$ M.DATA1 may be further increased according to a difference between paths from the memory banks 1100 to an output unit in which the first merged data $1^{st}$ M.DATA0 and $1^{st}$ M.DATA1 are output to the second merge circuit 1400.

As such, when the phase difference between the first merged data $1^{st}$ M.DATA0 and $1^{st}$ M.DATA1 becomes large, a failure may occur in second merging in the second merge circuit 1400. Thus, phases of clock signals input to the respective memory banks 1100 are adjusted through the clock signal adjuster 1700, so that the output timings of the first merged data $1^{st}$ M.DATA0 and $1^{st}$ M.DATA1 can be adjusted such that the phase difference between the first merged data $1^{st}$ M.DATA0 and $1'$M.DATA1 is decreased.

Figure 8:
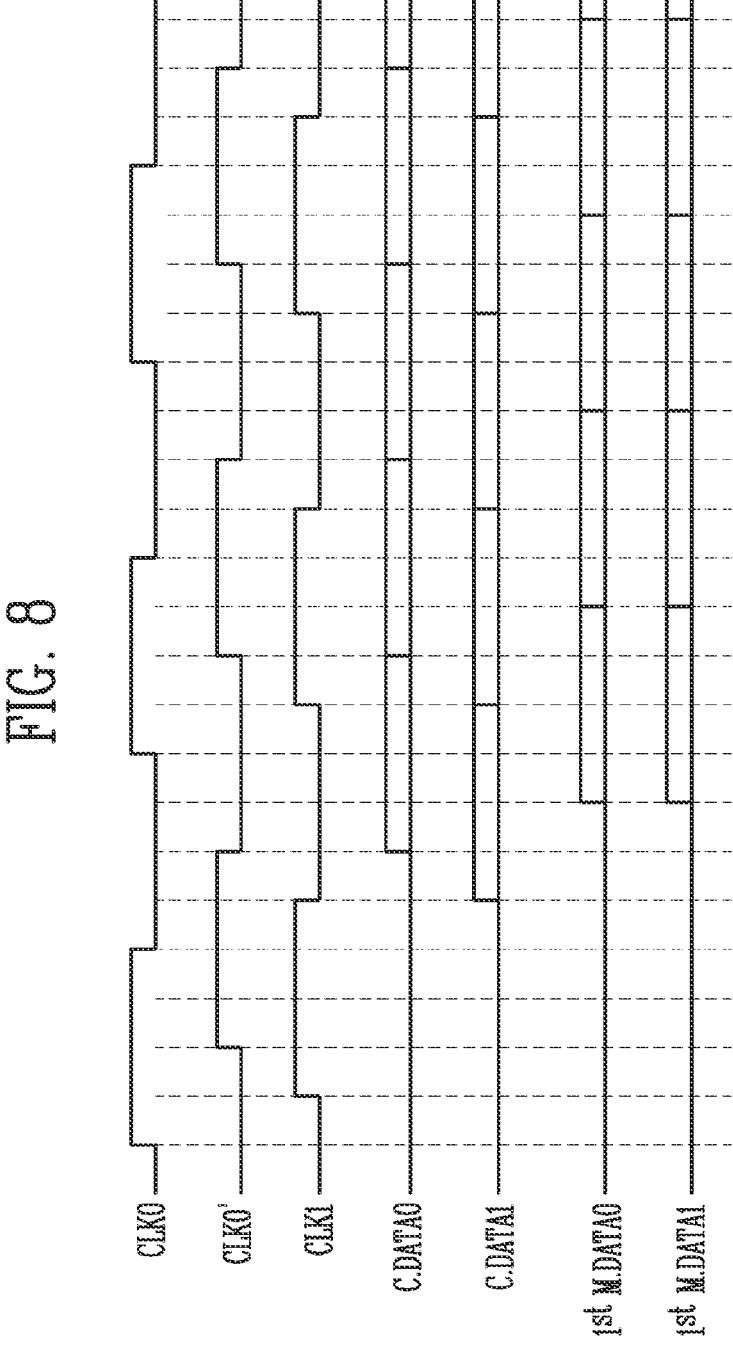
FIG. 8 is a timing diagram illustrating an output of data when an adjusted clock signal is provided to the memory device in accordance with an embodiment of the present disclosure.

FIG. 8 is a timing diagram illustrating an output of data when an adjusted clock signal is provided to the memory device in accordance with an embodiment of the present disclosure.

Referring to FIGS. 4 to 6 and 8, the clock signal adjuster 1700 may delay the clock signal CLK0 output from the clock signal generator 1600, to provide the delayed clock signal CLK0' to the memory bank 0 BK0. The clock signal CLK1 output from the clock signal generator 1600 may be provided as it is to the memory bank 1 BK1.

The memory banks 0 and 1 BK0 and BK1 may generate output control signals, based on the clock signals 0' and 1 CLK0' and CLK1, and the read data R.DATA0 and R.DATA1 and the compressed data C.DATA0 and C.DATA1 may be output to be synchronized with the output control.

Output timings of the compressed data C.DATA0 and C.DATA1 may have a difference corresponding to a phase difference between the clock signals 0' and 1 CLK0' and CLK1.

The first merge circuit 1300 may output first merged data 1$^{st}$ M.DATA0 and 1$^{st}$ M.DATA1 by merging the compressed data C.DATA0 and C.DATA1 respectively with other compressed data C.DATA2 and C.DATA3, and output timings of the first merged data 1$^{st}$ M.DATA0 and 1$^{st}$ M.DATA1 may become the same according to a difference between paths from the memory banks 1100 to an output unit in which the first merged data 1$^{st}$ M.DATA0 and 1$^{st}$ M.DATA1 are output to the second merge circuit 1400.

That is, as phases of clock signals input to the respective memory banks 1100 are adjusted through the clock signal adjuster 1700, the phase difference between the first merged data 1$^{st}$ M.DATA0 and 1'M.DATA1 is decreased, and accordingly, a failure in second merging, which may occur in the second merge circuit 1400, can be mitigated, reduced, or prevented.

Figure 9:
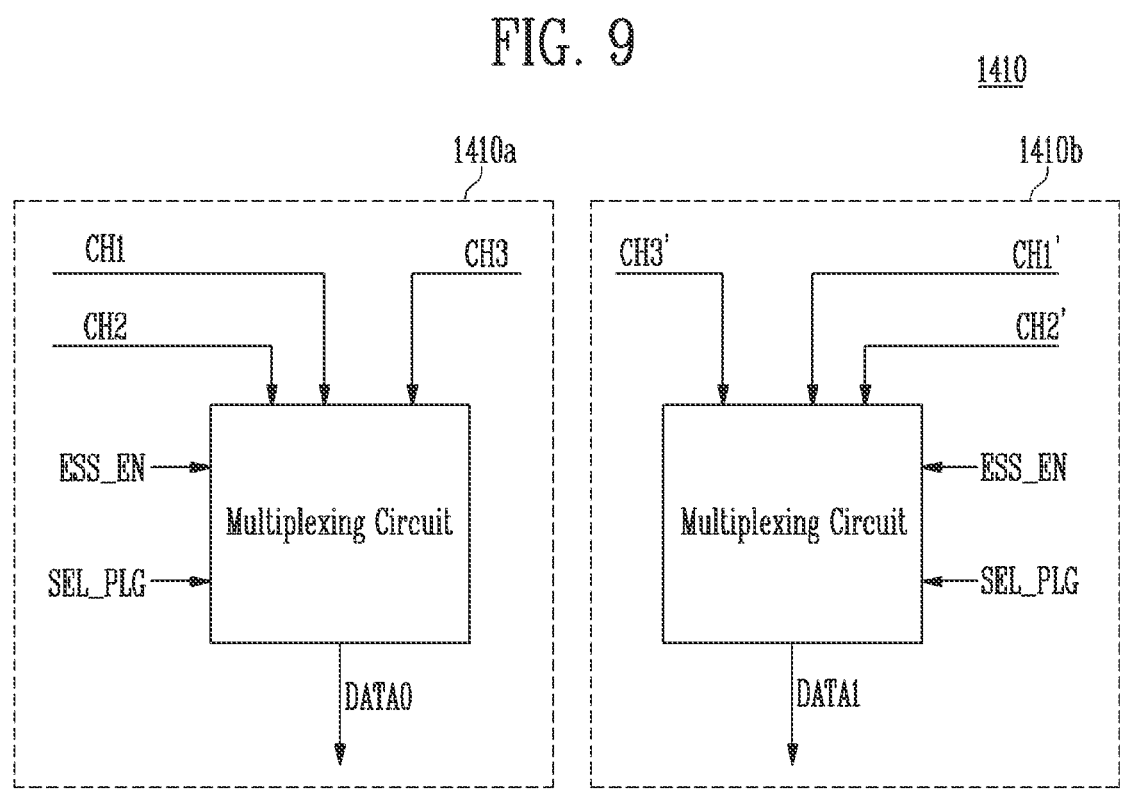
FIG. 9 is a diagram illustrating a data merge circuit shown in FIG. 3.

FIG. 9 is a diagram illustrating the data merge circuit shown in FIG. 3.

Referring to FIGS. 1, 3, and 9, the data merge circuit 1410 may include a plurality of multiplexing circuits 1410a and 1410b. Each of the plurality of multiplexing circuits 1410a and 1410b may include a first channel unit CH1 or CH1' and a second channel unit CH2 or CH2', to which data respectively generated from a plurality of first merge groups 1120 included in any one second merge group 1140 in any one plane group 1130 are input. Also, each of the plurality of multiplexing circuits 1410a and 1410b may include a third channel unit CH3 or CH3' to which data generated from a first merge group 1120 included in any one second merge group 1140 in another plane group 1130 is input. Each of the first channel unit CH1 or CH1', the second channel unit CH2 or CH2', and the third channel unit CH3 or CH3' may include one or more channels.

Each of the plurality of multiplexing circuits 1410a and 1410b may enable at least a portion selected from the group consisting of the first channel unit CH1 or CH1', the second channel unit CH2 or CH2', and the third channel unit CH3 or CH3', based on at least one selected from the group consisting of a compression read enable signal and a plane group select signal. More specifically, each of the plurality of multiplexing circuits 1410a and 1410b may enable at least a portion of one or more channels included in the first channel unit CH1 or CH1, one or more channels included in the second channel unit CH2 or CH2, and one or more channels included in the third channel unit CH3 or CH3', based on at least one selected from the group consisting of the compression read enable signal and the plane group select signal. In an embodiment, the compression read enable signal may indicate whether the compression read operation is enabled, and the plane group select signal may be a signal indicating a plane group to be selected among a plurality of plane groups.

Also, each of the plurality of multiplexing circuits 1410a and 1410b may receive data input from the enabled channels, and output data DATA0 or DATA1, based on the input data. The output data DATA0 or DATA1 may be normal read data or second merged data 2$^{nd}$ M.DATA according to whether the compression read operation is enabled.

In an embodiment, the first channel unit CH1 or CH1' may be a channel to which normal read data output from a plane group connected to the first channel unit CH1 or CH1' is input in disablement of the compression read operation, i.e., in the normal read operation. Accordingly, in the normal read operation, at least a portion of the channels included in the first channel unit CH1 or CH1' may be enabled according to the plane group select signal.

Also, the first channel unit CH1 or CH1' may be a channel to which first merged data 1$^{st}$ M.DATA generated from the plane group connected to the first channel unit CH1 or CH1' is input in enablement of the compression read operation, i.e., in the compression read operation. Accordingly, in the compression read operation, at least a portion of the channels included in the first channel unit CH1 or CH1' may be enabled.

In an embodiment, the second channel unit CH2 or CH2' may be a channel to which first merged data 1$^{st}$ M.DATA generated from a plane group connected to the second channel unit CH2 or CH2' is input in enablement of the compression read operation, i.e., in the compression read operation. Accordingly, in the compression read operation, at least a portion of the channels included in the second channel unit CH2 or CH2' may be enabled.

In an embodiment, the channel unit CH3 or CH3' may be a channel to which normal read data output from a plane group connected to the third channel unit CH3 or CH3' is input in disablement of the compression read operation, i.e., in the normal read operation. Accordingly, in the normal read operation, at least a portion of the channels included in the channel unit CH3 or CH3' may be enabled according to the plane group select signal.

For example, the multiplexing circuit 1410a may include a first channel unit CH1 connected to the zeroth plane group 1430, and the first channel unit CH1 may receive data generated from the first merge group 1120 including the memory banks 0 and 2 BK0 and BK2. Also, the multiplexing circuit 1410a may include a second channel unit CH2 connected to the zeroth plane group 1430, and the second channel unit CH2 may receive data generated from the first merge group 1120 including the memory banks 1 and 3 BK1 and BK3. Also, the multiplexing circuit 1410a may include a third channel unit CH3 connected to the first plane group 1430, and the third channel unit CH3 may receive data generated from the first merge group 1120 including the memory banks 0' and 2' BK0' and BK2'.

For example, the multiplexing circuit 1410b may include a first channel unit CH1' connected to the first plane group 1430, and the first channel unit CH1' may receive data generated from the first merge group 1120 including the memory banks 1' and 3' BK1' and BK3'. Also, the multiplexing circuit 1410b may include a second channel unit CH2' connected to the first plane group 1430, and the second channel unit CH2' may receive data generated from the first merge group 1120 including the memory banks 0' and 2' BK0' and BK2'. Also, the multiplexing circuit 1410b may include a third channel unit CH3' connected to the zeroth plane group 1430, and the third channel unit CH3' may receive data generated from the first merge group 1120 including the memory banks 1 and 3 BK1 and BK3.

Figure 10:
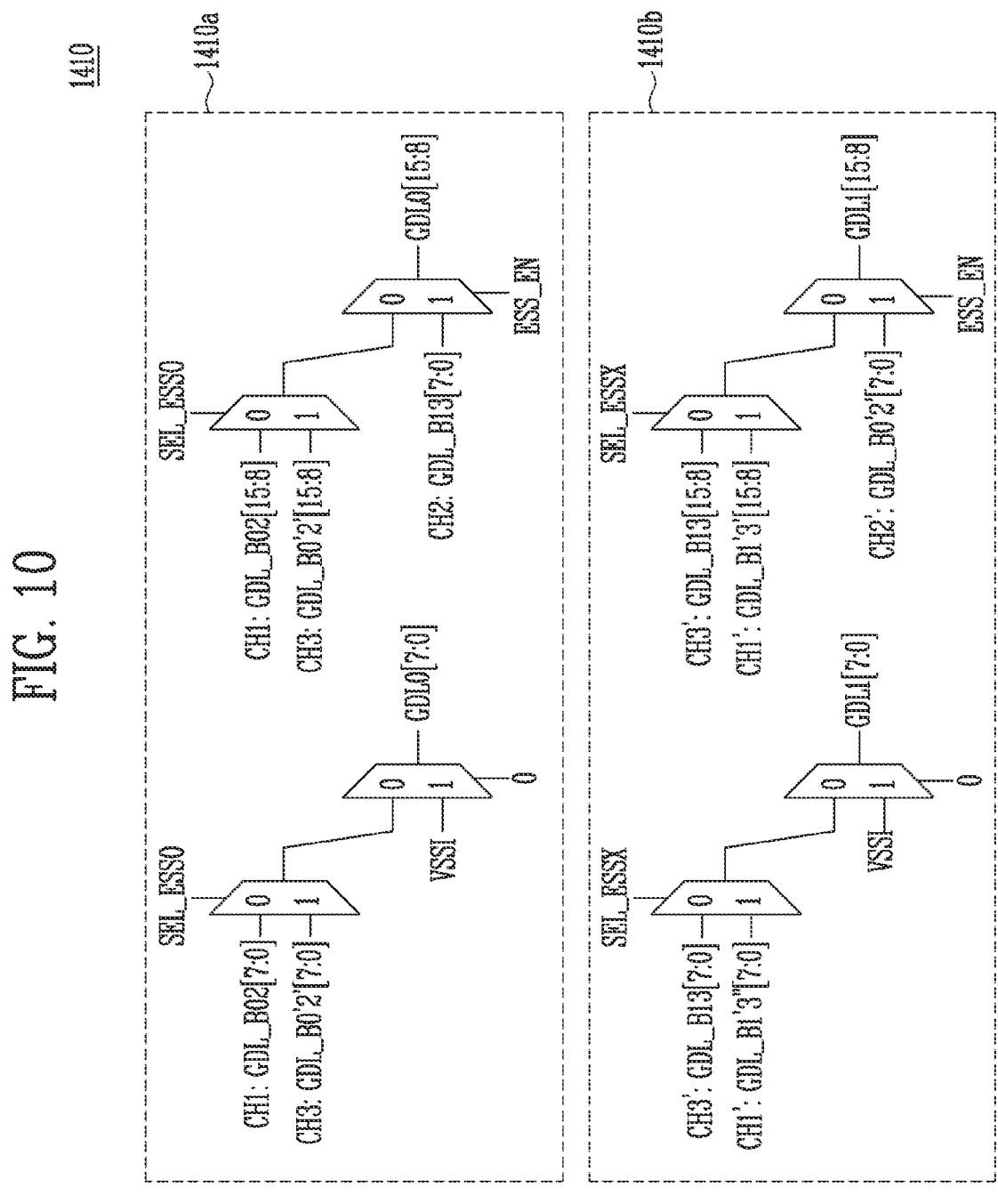
FIG. 10 is a diagram illustrating an example of a multiplexing circuit shown in FIG. 9.

FIG. 10 is a diagram illustrating an example of the multiplexing circuit shown in FIG. 9.

Referring to FIGS. 1, 3, 9, and 10, the multiplexing circuits 1410a and 1410b may include a plurality of multiplexers, and the multiplexers may select and output a portion of input data, based on signals ESS_EN, SEL_ESSO, and SEL_ESSX acquired by combining the compression read enable signal and the plane group select signal.

In an embodiment, the multiplexing circuit 1410a may include a channel unit CH1 connected to the zeroth plane group 1430, and the first channel unit CH1 may include a channel GDL_B02[7:0] receiving 0-bit to 7-bit data from the first merge group 1120 including the memory banks 0 and 2 BK0 and BK2 and a channel GDL_B02[15:8] receiving 8-bit to 15-bit data from the first merge group 1120 including the memory banks 0 and 2 BK0 and BK2. Also, the multiplexing circuit 1410*a* may include a second channel unit CH2 connected to the zeroth plane group 1430, and the second channel unit CH2 may include a channel GDL_B13 [7:0] receiving 0-bit to 7-bit data from the first merge group 1120 including the memory banks 1 and 3 BK1 and BK3. Also, the multiplexing circuit 1410*a* may include a third channel unit CH3 connected to the first plane group 1430, and the third channel unit CH3 may include a channel GDL_B0'2' [7:0] receiving 0-bit to 7-bit data from the first merge group 1120 including the memory banks 0' and 2' BK0' and BK2' and a channel GDL_B0'2'[15:8] receiving 8-bit to 15-bit data from the first merge group 1120 including the memory banks 0' and 2' BK0' and BK2'.

In an embodiment, the multiplexing circuit 1410*a* may select and enable one channel among the channel GDL_B02 [7:0] included in the first channel unit CH1 and the channel GDL_B0'2' [7:0] included in the third channel unit CH3, based on the compression read enable signal and the plane group select signal. Data input from the enabled channel may be output through a 0-bit to 7-bit zeroth output line GDL0[7:0]. Also, in an embodiment, the multiplexing circuit 1410*a* may select and enable one channel among the channel GDL_B02[15:8] included in the first channel unit CH1, the channel GDL_B0'2'[15:8] included in the third channel CH3, and the channel GDL_B13[7:0] included in the second channel unit CH2, based on the compression read enable signal and the plane group select signal. Data input from the enabled channel may be output through an 8-bit to 15-bit zeroth output line GDL0[15:8].

In an embodiment, the multiplexing circuit 1410*b* may include a first channel unit CH1' connected to the first plane group 1430, and the first channel unit CH1' may include a channel GDL_B1'3'[7:0] receiving 0-bit to 7-bit data from the first merge group 1120 including the memory banks 1' and 3' BK1' and BK3' and a channel GDL_B1'3'[15:8] receiving 8-bit to 15-bit data from the first merge group 1120 including the memory banks 1' and 3' BK1' and BK3'. Also, the multiplexing circuit 1410*b* may include a second channel unit CH2' connected to the first plane group 1430, and the second channel unit CH2' may include a channel GDL_B0'2' [7:0] receiving 0-bit to 7-bit data from the first merge group 1120 including the memory banks 0' and 2' BK0' and BK2'. Also, the multiplexing circuit 1410*b* may include a third channel unit CH3' connected to the zeroth plane group 1430, and the third channel unit CH3' may include a channel GDL_B13[7:0] receiving 0-bit to 7-bit data from the first merge group 1120 including the memory banks 1 and 3 BK1 and BK3 and a channel GDL_B13[15:8] receiving 8-bit to 15-bit data from the first merge group 1120 including the memory banks 1 and 3 BK1 and BK3.

In an embodiment, the multiplexing circuit 1410*b* may select and enable one channel among the channel GDL_B1'3'[7:0] included in the first channel unit CH1' and the channel GDL_B13[7:0] included in the third channel unit CH3, based on the compression read enable signal and the plane group select signal. Data input from the enabled channel may be output through a 0-bit to 7-bit first output line GDL1[7:0]. Also, in an embodiment, the multiplexing circuit 1410*b* may select and enable one channel among the channel GDL_B1'3'[15:8] included in the first channel unit CH1', the channel GDL_B1'3'[15:8] included in the third channel unit CH3', and the channel GDL_B0'2'[7:0] included in the second channel unit CH2, based on the compression read enable signal and the plane group select signal. Data input from the enabled channel may be output through an 8-bit to 15-bit first output line GDL1[15:8].

Figure 11:
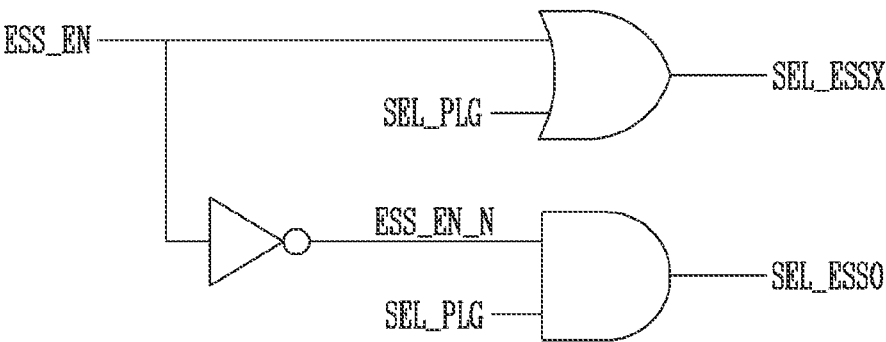
FIG. 11 is a diagram illustrating an example of signals used in FIG. 10.

FIG. 11 is a diagram illustrating an example of signals used in FIG. 10.

Referring to FIGS. 10 and 11, a compression read enable signal ESS_EN and a plane group select signal SEL_PLG may be input to the multiplexing circuits 1410*a* and 1410*b*, or signals SEL_ESSO and SEL_ESSX acquired by combining the compression read enable signal ESS_EN and the plane group select signal SEL_PLG may be input to the multiplexing circuits 1410*a* and 1410*b*.

For example, the signal SEL_ESSO may be a signal acquired by performing an AND operation on an inverting value ESS_EN_N of the compression read enable signal ESS_EN and the plane group select signal SEL_PLG. In addition, the signal SEL_ESSX may be a signal acquired by performing an OR operation on the compression read enable signal ESS_EN and the plane group select signal SEL_PLG.

For example, when the compression read operation is enabled, the compression read enable signal ESS_EN may have a value of 1. When the compression read operation is disabled, the compression read enable signal ESS_EN may have a value of 0. In addition, when the zeroth plane group is selected, the plane group select signal SEL_PLG may have a value of 1. When the first plane group is selected, the plane group select signal SEL_PLG may have a value of 1. Because no specific plane group is selected in the compression read operation, both the first plane group and the second plane group are selected, and therefore, the plane group select signal SEL_PLG may have the value of 1.

Figure 12:
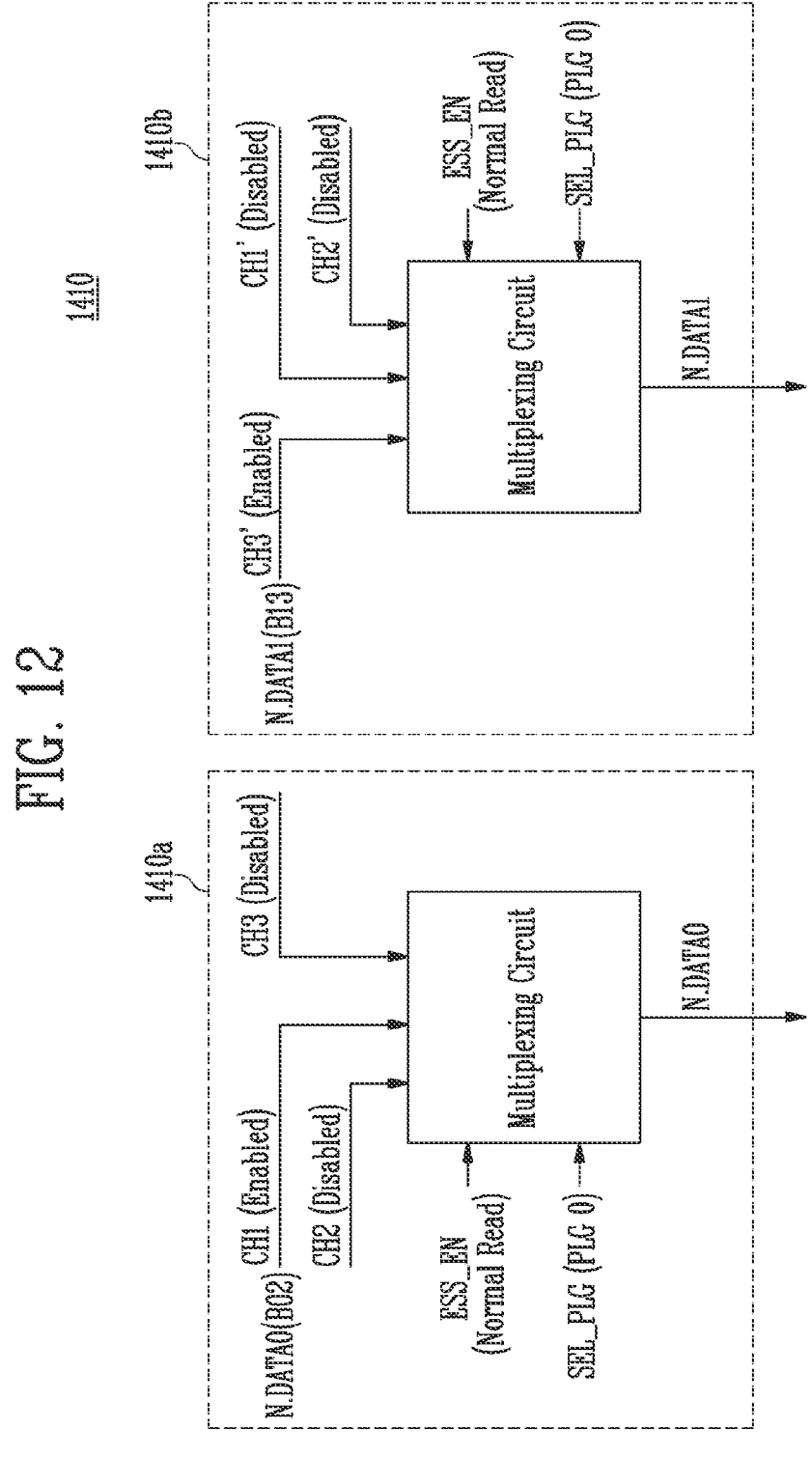
FIG. 12 is a diagram illustrating a normal read operation of the data merge circuit shown in FIG. 9 in accordance with an embodiment of the present disclosure.

FIG. 12 is a diagram illustrating a normal read operation of the data merge circuit shown in FIG. 9 in accordance with an embodiment of the present disclosure.

Referring to FIGS. 1, 9, and 12, the memory device 1000 may perform a normal read operation on the zeroth plane group 1130. Accordingly, the compression read enable signal ESS_EN may indicate disablement of the compression read operation, i.e., the normal read operation, and the plane group select signal SEL_PLG may indicate the zeroth plane group 1130.

In an embodiment, based on the compression read enable signal ESS_EN and the plane group select signal SEL_PLG, the multiplexing circuit 1410*a* may enable at least a portion of the channels included in the first channel unit CH1, and disable the channels included in the second channel unit CH2 and the third channel unit CH3.

Accordingly, normal data N.DATA0(B02) may be input from the first merge group 1120 including the memory banks 0 and 2 BK0 and BK2 in the zeroth plane group through the enabled channel of the first channel unit CH1, and the input normal data N.DATA0(B02) may be output from the multiplexing circuit 1410*a*.

In an embodiment, based on the compression read enable signal ESS_EN and the plane group select signal SEL_PLG, the multiplexing circuit 1410*b* may enable at least a portion of the channels included in the third channel unit CH3', and disable the first channel unit CH1' and the second channel unit CH2'.

Accordingly, normal data N.DATA1(B13) may be input from the first merge group 1120 including the memory banks 1 and 3 BK1 and BK3 in the zeroth plane group through the enabled channel of the third channel unit CH3', and the input normal data N.DATA1(B13) may be output from the multiplexing circuit 1410*b*.

Figure 13:
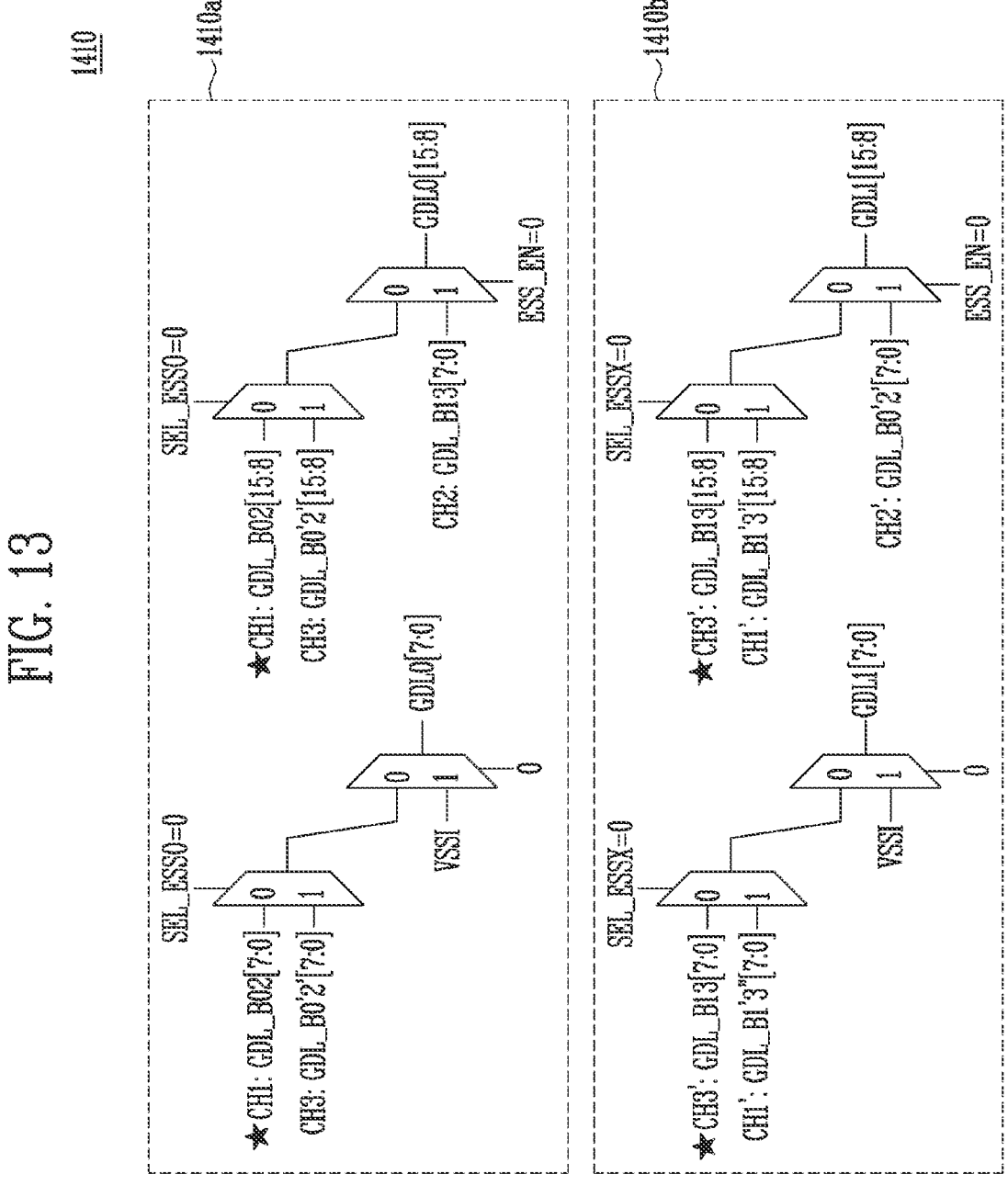
FIG. 13 is a diagram illustrating an example of a multiplexing circuit shown in FIG. 12.

FIG. 13 is a diagram illustrating an example of the multiplexing circuit shown in FIG. 12.

Referring to FIGS. 1 and 9 to 13, when the normal read operation on the zeroth plane group 1130 is performed, in an embodiment, the compression read enable signal ESS_EN may have a value of 0, and the plane group select signal SEL_PLG may have a value of 0. Therefore, the signal SEL_ESSO may have a value of 0 according to the AND operation on the inverting value ESS_EN_N of the compression read enable signal ESS_EN and the plane group select signal SEL_PLG. In addition, the signal SEL_ESSX may have a value of 0 according to the OR operation on the compression read enable signal ESS_EN and the plane group select signal SEL_PLG.

In an embodiment, the multiplexing circuit 1410a may enable the channel GDL_B02[7:0] included in the first channel unit CH1 according to the signal SEL_ESSO. Data input from the enabled channel GDL_B02[7:0] may be output through the 0-bit to 7-bit zeroth output line GDL0 [7:0]. Also, in an embodiment, the multiplexing circuit 1410a may enable the channel GDL_B02[15:8] included in the first channel unit CH1 according to the compression read enable signal ESS_EN and the signal SEL_ESSO. Data input from the enabled channel GDL_B02[15:8] may be output through the 8-bit to 15-bit zeroth output line GDL0 [15:8].

In an embodiment, the multiplexing circuit 1410b may enable the channel GDL_B13[7:0] included in the third channel unit CH3' according to the signal SEL_ESSX. Data input from the enabled channel GDL_B13[7:0] may be output through the 0-bit to 7-bit zeroth output line GDL1 [7:0]. Also, in an embodiment, the multiplexing circuit 1410b may enable the channel GDL_B13[15:8] included in the third channel unit CH3' according to the signal SEL_ESSX. The data input from the enabled channel GDL_B13[15:8] may be output through the 8-bit to 15-bit first output line GDL1[15:8].

Figure 14:
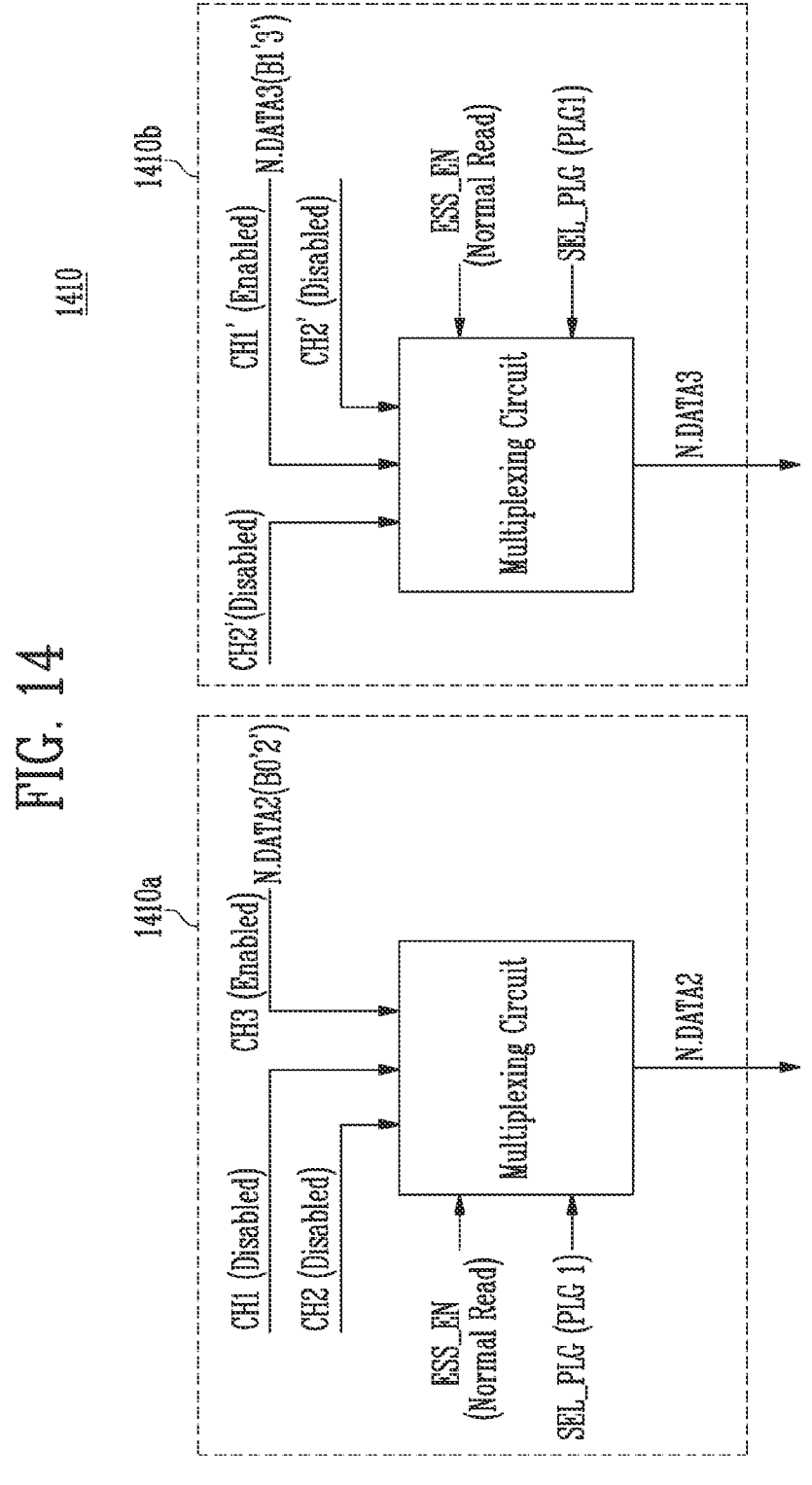
FIG. 14 is a diagram illustrating a normal read operation of the data merge circuit shown in FIG. 9 in accordance with another embodiment of the present disclosure.

FIG. 14 is a diagram illustrating a normal read operation of the data merge circuit shown in FIG. 9 in accordance with another embodiment of the present disclosure.

Referring to FIGS. 1, 9, and 14, the memory device 1000 may perform a normal read operation on the first plane group 1130. Accordingly, the compression read enable signal ESS_EN may indicate disablement of the compression read operation, i.e., the normal read operation, and the plane group select signal SEL_PLG may indicate the first plane group 1130.

In an embodiment, based on the compression read enable signal ESS_EN and the plane group select signal SEL_PLG, the multiplexing circuit 1410a may enable at least a portion of the channels included in the third channel unit CH3, and disable the channels included in the first channel unit CH1 and the second channel unit CH23.

Accordingly, normal data N.DATA2(B0'2') may be input from the first merge group 1120 including the memory banks 0' and 2' BK0' and BK2' in the first plane group through the enabled channel of the third channel unit CH3, and the input normal data N.DATA2(B0'2') may be output from the multiplexing circuit 1410a.

In an embodiment, based on the compression read enable signal ESS_EN and the plane group select signal SEL_PLG, the multiplexing circuit 1410b may enable at least a portion of the channels included in the first channel unit CH1', and disable the second channel unit CH2' and the third channel unit CH3'.

Accordingly, normal data N.DATA3(B1'3') may be input from the first merge group 1120 including the memory banks 1' and 3' BK1' and BK3' in the first plane group through the enabled channel of the third channel unit CH3', and the input normal data N.DATA3(B1'3') may be output from the multiplexing circuit 1410b.

Figure 15:
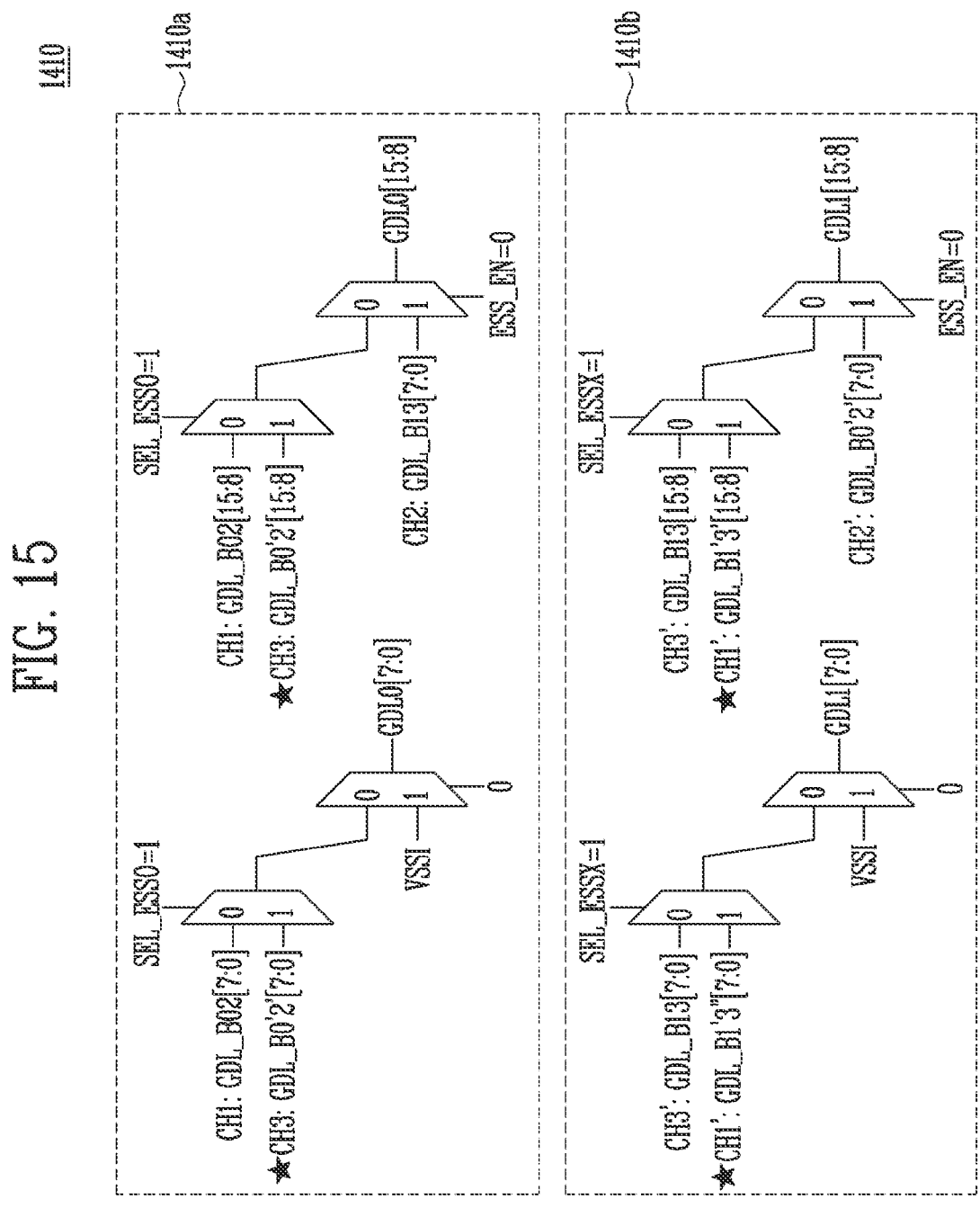
FIG. 15 is a diagram illustrating an example of a multiplexing circuit shown in FIG. 14.

FIG. 15 is a diagram illustrating an example of the multiplexing circuit shown in FIG. 14.

Referring to FIGS. 1, 9 to 11, 14, and 15, when the normal read operation on the first plane group 1130 is performed, in an embodiment, the compression read enable signal ESS_EN may have a value of 0, and the plane group select signal SEL_PLG may have a value of 1. Therefore, the signal SEL_ESSO may have a value of 1 according to the AND operation on the inverting value ESS_EN_N of the compression read enable signal ESS_EN and the plane group select signal SEL_PLG. In addition, the signal SEL_ESSX may have a value of 1 according to the OR operation on the compression read enable signal ESS_EN and the plane group select signal SEL_PLG.

In an embodiment, the multiplexing circuit 1410a may enable the channel GDL_B0'2'[7:0] included in the third channel unit CH3 according to the signal SEL_ESSO. Data input from the enabled channel GDL_B0'2'[7:0] may be output through the 0-bit to 7-bit zeroth output line GDL0 [7:0]. Also, in an embodiment, the multiplexing circuit 1410a may enable the channel GDL_B0'2'[15:8] included in the third channel unit CH3 according to the compression read enable signal ESS_EN and the signal SEL_ESSO. Data input from the enabled channel GDL_B0'2'[15:8] may be output through the 8-bit to 15-bit zeroth output line GDL0 [15:8].

In an embodiment, the multiplexing circuit 1410b may enable the channel GDL_B1'3'[7:0] included in the first channel unit CH1' according to the signal SEL_ESSX. Data input from the enabled channel GDL_B1'3'[7:0] may be output through the 0-bit to 7-bit zeroth output line GDL1 [7:0]. Also, in an embodiment, the multiplexing circuit 1410b may enable the channel GDL_B1'3'[15:8] included in the first channel unit CH1' according to the signal SEL_ESSX. The data input from the enabled channel GDL_B1'3'[15:8] may be output through the 8-bit to 15-bit first output line GDL1[15:8].

Figure 16:
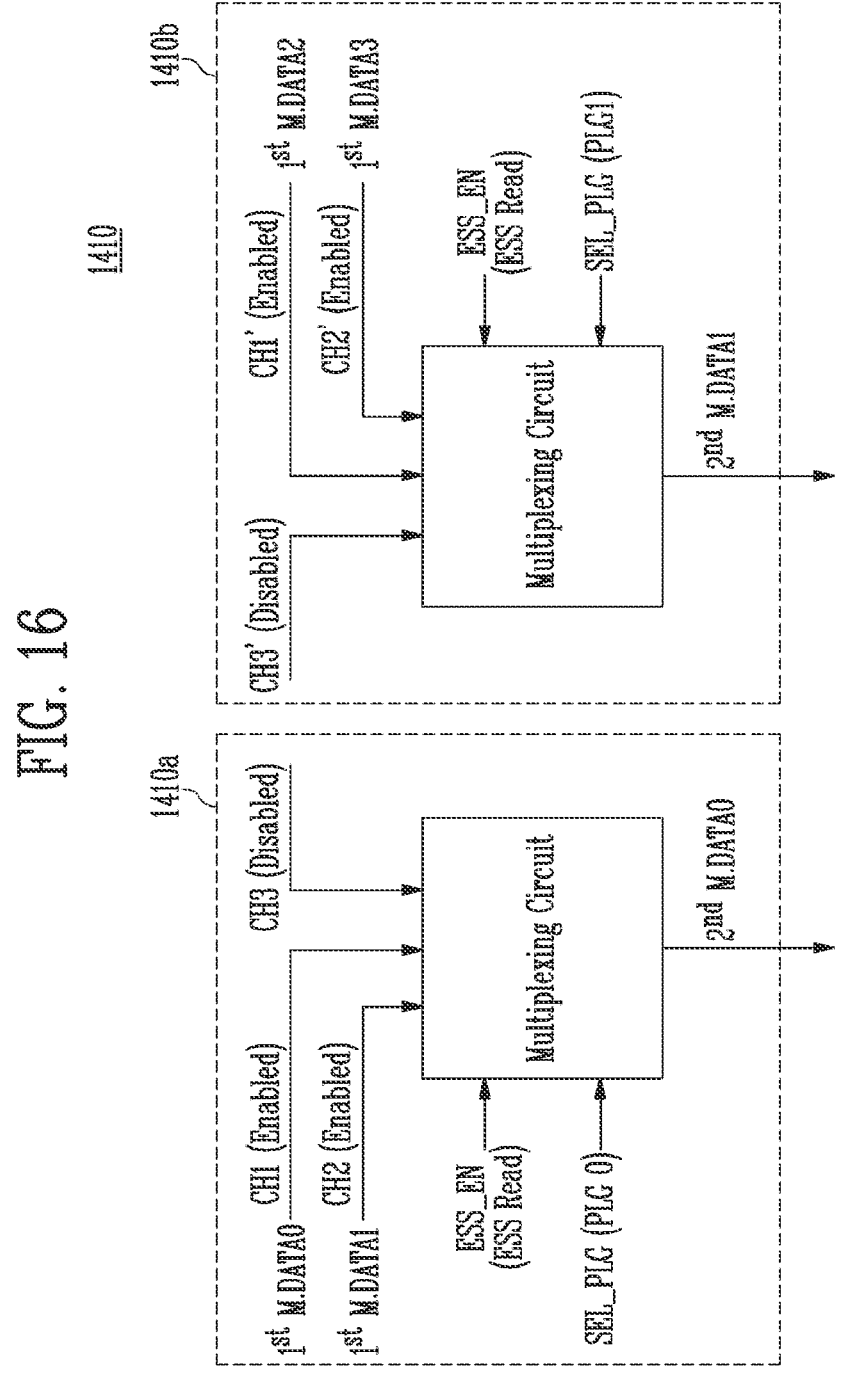
FIG. 16 is a diagram illustrating a compression read operation of the data merge circuit shown in FIG. 9 in accordance with an embodiment of the present disclosure.

FIG. 16 is a diagram illustrating a compression read operation of the data merge circuit shown in FIG. 9 in accordance with an embodiment of the present disclosure.

Referring to FIGS. 1, 9, and 16, the memory device 1000 may perform a compression read operation on the first and second plane groups 1130. Accordingly, the compression read enable signal ESS_EN may indicate enablement of the compression read operation, and the plane group select signal SEL_PLG may indicate that the first and second plane groups 1130 have been selected.

In an embodiment, based on the compression read enable signal ESS_EN and the plane group select signal SEL_PLG, the multiplexing circuit 1410a may enable at least a portion of the channels included in the first channel unit CH1 and at least a portion of the channels included in the second channel unit CH2, and disable the channel included in the third channel unit CH3.

Accordingly, first merged data $1^{st}$ M.DATA0 and $1^{st}$ M.DATA1 generated from the memory banks BK0 to BK3 in the zeroth plane group may be input through the enabled channels of the first channel unit CH1 and the second channel unit CH2, respectively. The input the first merged data $1^{st}$ M.DATA0 and $1^{st}$ M.DATA1 may be merged to be output as second merged data $2^{nd}$ M.DATA0 from the multiplexing circuit 1410a.

In an embodiment, based on the compression read enable signal ESS_EN and the plane group select signal SEL_PLG, the multiplexing circuit 1410*b* may enable at least a portion of the channels included in the first channel unit CH1' and at least a portion of the channels included in the second channel unit CH2', and disable the channels included in the third channel unit CH3'.

Accordingly, first merged data 1$^{st}$ M.DATA2 and 1$^{st}$ M.DATA3 generated from the memory banks BK0' to BK3' in the first plane group may be input through the enabled channels of the first channel unit CH1' and the second channel unit CH2', respectively. The input the first merged data 1$^{st}$ M.DATA2 and 1$^{st}$ M.DATA3 may be merged to be output as second merged data 2$^{nd}$ M.DATA1 from the multiplexing circuit 1410*b*.

Figure 17:
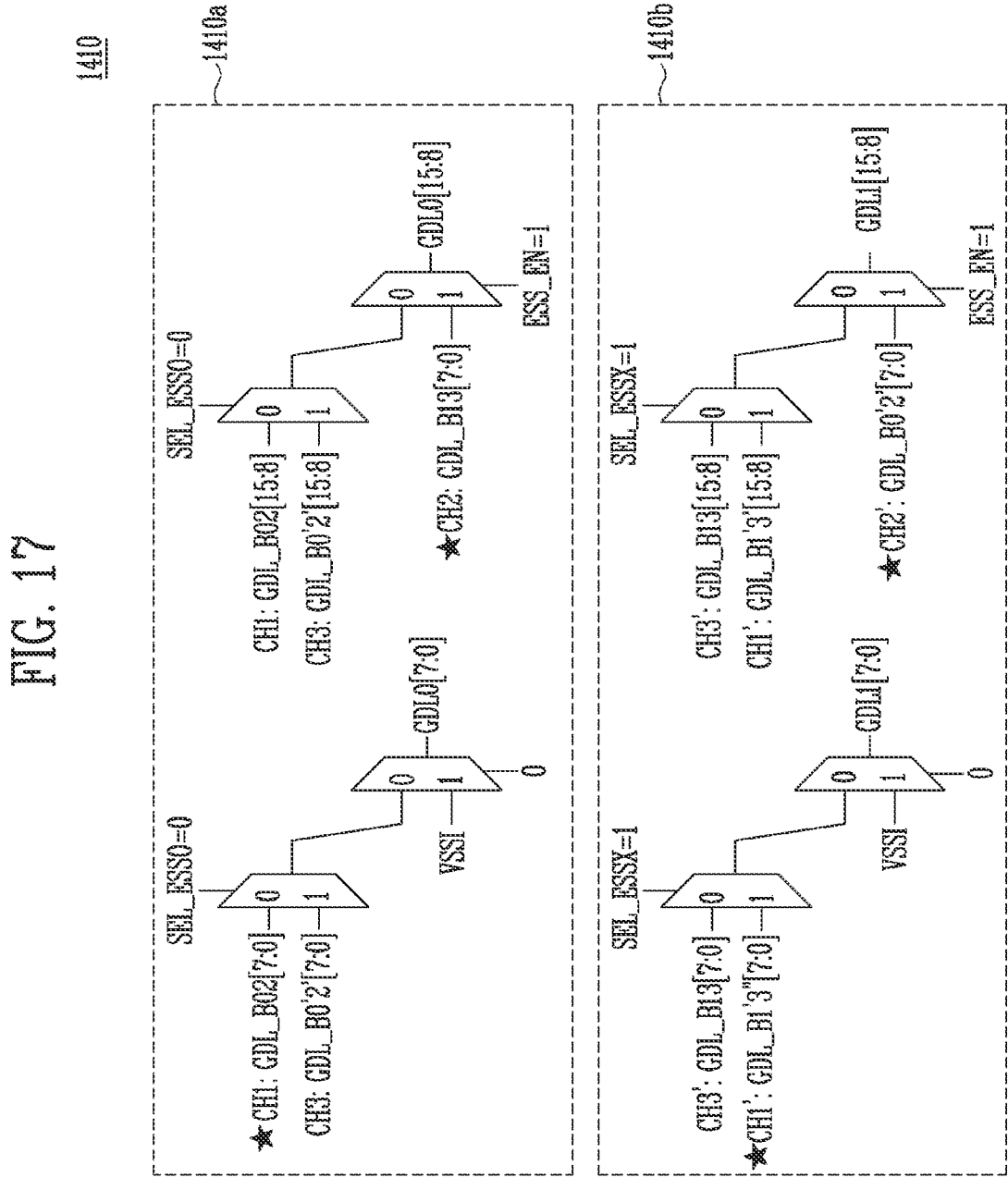
FIG. 17 is a diagram illustrating an example of a multiplexing circuit shown in FIG. 16.

FIG. 17 is a diagram illustrating an example of the multiplexing circuit shown in FIG. 16.

Referring to FIGS. 1, 9 to 11, 14, 15, and 17, when the compression read operation on the plurality of plane groups 1130, in an embodiment, the compression read enable signal ESS_EN may have a value of 1, and the plane group select signal SEL_PLG may have a value of 1. Therefore, the signal SEL_ESSO may have a value of 0 according to the AND operation on the inverting value ESS_EN_N of the compression read enable signal ESS_EN and the plane group select signal SEL_PLG. In addition, the signal SEL_ESSX may have a value of 1 according to the OR operation on the compression read enable signal ESS_EN and the plane group select signal SEL_PLG.

In an embodiment, the multiplexing circuit 1410*a* may enable the channel GDL_B02[7:0] included in the first channel unit CH1 according to the signal SEL_ESSO. Data input from the enabled channel GDL_B02[7:0] may be output through the 0-bit to 7-bit zeroth output line GDL0 [7:0]. Also, in an embodiment, the multiplexing circuit 1410*a* may enable the channel GDL_B13[7:0] included in the second channel unit CH2 according to the compression read enable signal ESS_EN and the signal SEL_ESSO. Data input from the enabled channel GDL_B13[7:0] may be output through the 8-bit to 15-bit zeroth output line GDL0 [15:8].

In an embodiment, the multiplexing circuit 1410*b* may enable the channel GDL_B1'3'[7:0] included in the first channel unit CH1' according to the SEL_ESSX. Data input from the enabled channel GDL_B1'3'[7:0] may be output through the 0-bit to 7-bit first output line GDL1[7:0]. Also, in an embodiment, the multiplexing circuit 1410*b* may enable the channel GDL_B0'2'[15:8] included in the second channel unit CH2' according to the compression read enable signal ESS_EN and the signal SEL_ESSX. The data input from the enabled channel GDL_B0'2'[15:8] may be output through the 8-bit to 15-bit first output line GDL1[15:8].

Accordingly, each of the multiplexing circuits 1410*a* and 1410*b* may merge and output first merged data 1$^{st}$ M.DATA corresponding to different first merge groups 1120 included in the same plane group 1130. More specifically, each of the multiplexing circuits 1410*a* and 1410*b* may merge and output first merged data 1$^{st}$ M.DATA corresponding to different first merge groups 1120 included in the same second merge group 1140.

As described with reference to FIGS. 10 to 14, the memory device in accordance with the embodiment of the present disclosure can perform the compression read operation without greatly changing the design of the existing memory device performing the normal read operation, and mitigate, reduce, or minimize a merge failure which may occur in a merge process of data when the compression read operation is performed.

Figure 18:
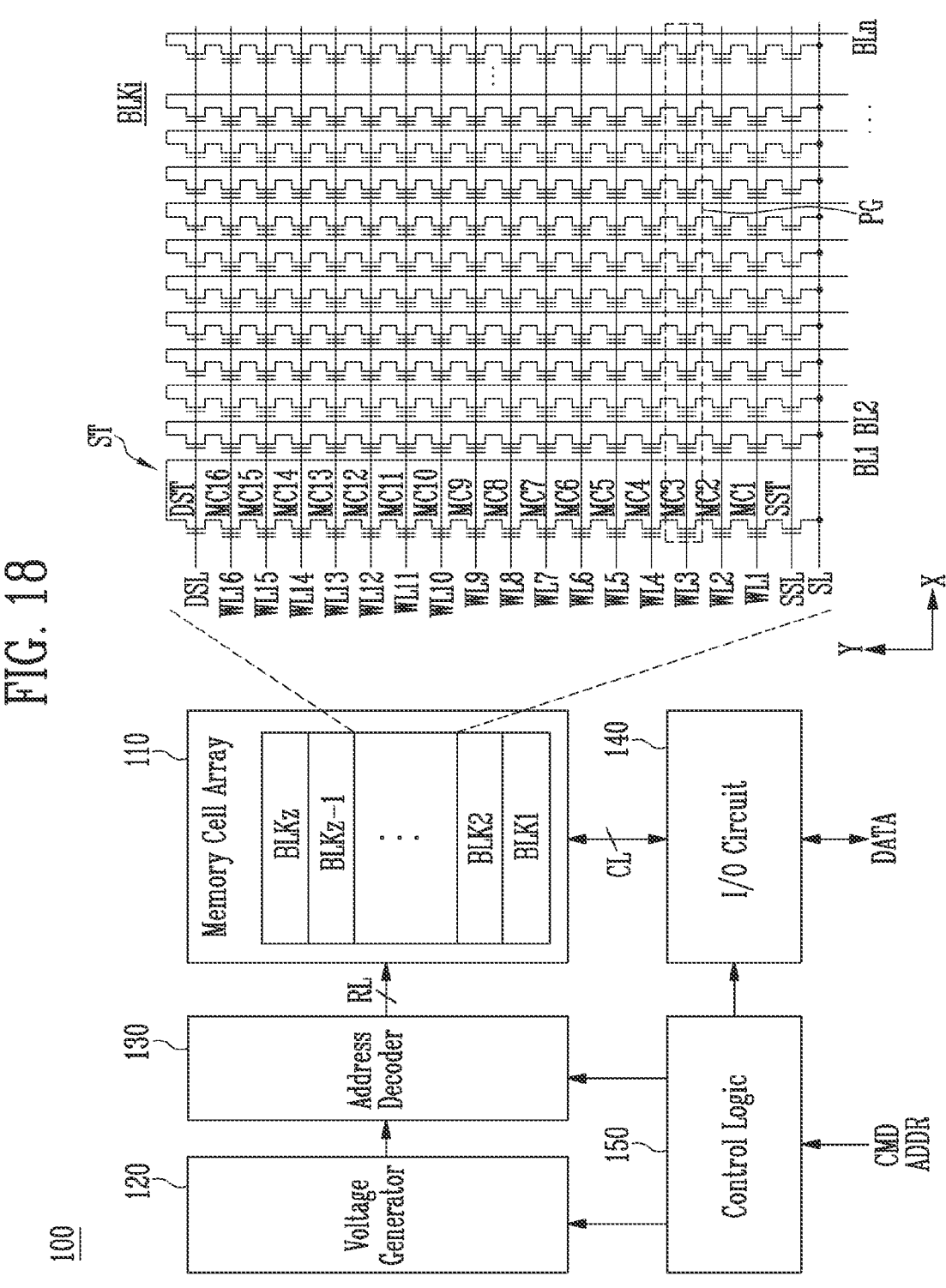
FIG. 18 is a block diagram illustrating another embodiment of the memory device shown in FIG. 1.

FIG. 18 is a block diagram illustrating another embodiment of the memory device shown in FIG. 1.

Referring to FIG. 18, a memory device 100 may include a memory cell array 110, a voltage generator 120, an address decoder 130, an input/output circuit 140, and control logic 150.

The memory cell array 110 may include a plurality of memory blocks BLK1 to BLKz. The plurality of memory blocks BLK1 to BLKz may be connected to the address decoder 130 through row lines RL. The plurality of memory blocks BLK1 to BLKz may be connected to the input/output circuit 140 through column lines CL. In an embodiment, the row lines RL may include word lines, source select lines, and drain select lines. In an embodiment, the column lines may include bit lines.

Each of the plurality of memory blocks BLK1 to BLKz includes a plurality of memory cells. In an embodiment, the plurality of memory cells may be nonvolatile memory cells.

In any one memory block BLKi among the plurality of memory blocks, a plurality of word lines arranged in parallel to each other may be connected between a first select line and a second select line. The first select line may be a source select line SSL, and the second select line may be a drain select line DSL. More specifically, the memory block BLKi may include a plurality of strings ST connected between bit lines BL1 to BLn and a source line SL. The bit lines BL1 to BLn may be respectively connected to the strings ST, and the source line SL may be commonly connected to the strings ST. The strings ST may be configured identically to one another, and therefore, a string ST connected to a first bit line BL1 will be described in detail as an example.

The string ST may include a source select transistor SST, a plurality of memory cells MC1 to MC16, and a drain select transistor DAT, which are connected in series to each other between a source line SL and a first bit line BL1. At least one source select transistor SST and at least one drain select transistor DST may be included in one string ST, and memory cells of which number is greater than the number of the memory cells MC1 to MC16 shown in the drawing may be included in the one string ST.

A source of the source select transistor SST may be connected to the source line SL, and a drain of the drain select transistor DST may be connected to the first bit line BL1. The memory cells MC1 to MC16 may be connected in series between the source select transistor SST and the drain select transistor DST. Gates of source select transistors SST included in different strings ST may be connected to the source select line SSL, and gates of drain select transistors DST included in different strings ST may be connected to the drain select line DSL. Gates of the memory cells MC1 to MC16 may be connected to a plurality of word lines WL1 to WL16. A group of memory cells connected to the same word line among memory cells included in different strings ST may be referred to as a physical page PPG. Therefore, physical pages PPG of which number corresponds to the number of the word lines WL1 to WL16 may be included in the memory block BLKi.

Each of the memory cells may be configured as a Single Level Cell (SLC) storing one data bit, a Multi-Level Cell (MLC) storing two data bits, a Triple Level Cell (TLC) storing three data bits, or a Quadruple Level Cell (QLC) storing four data bits.

The SLC may store one-bit data. One physical page PPG of the SLC may store one logical page data. One logical page data may include data bits of which number corresponds to the number of cells included in one physical page PPG.

The MLC, the TLC, and the QLC may store two-or-more-bit data. One physical page PPG may store two or more logical page data.

The memory cell array 110 may be configured with a plurality of banks including a plurality of memory blocks. The memory bank may be identical to the memory bank 1100 described in FIG. 1. The memory cell array 110 may include a plurality of memory planes, and each of the memory planes may include a plurality of memory banks.

In an embodiment, the voltage generator 120, the address decoder 130, and the input/output circuit 140 may be collectively designated as a peripheral circuit. The peripheral circuit may drive the memory cell array 110 under the control of the control logic 150. The peripheral circuit may drive the memory cell array 110 to perform a program operation, a read operation, and an erase operation. Memory planes sharing the peripheral circuit among the plurality of planes may be grouped to constitute a plane group. In an embodiment, the plane group may include one or more second merge groups configured with adjacent memory banks, and each of the second merge groups may include one or more first merge groups configured with adjacent memory banks. In an embodiment, each of the first merge groups may include memory banks included in different memory planes.

The voltage generator 120 may generate a plurality of operating voltages by using an external power voltage supplied to the memory device 100. The voltage generator 120 may be operated under the control of the control logic 150.

In an embodiment, the voltage generator 120 may generate an internal power voltage by regulating the external power voltage. The internal power voltage generated by the voltage generator 120 may be used as an operating voltage of the memory device 100.

In an embodiment, the voltage generator 120 may generate a plurality of operating voltages by using the external power voltage or the internal power voltage. The voltage generator 120 may generate various voltages required in the memory device 100. For example, the voltage generator 120 may generate a plurality of erase voltages, a plurality of program voltages, a plurality of pass voltages, a plurality of select read voltages, and a plurality of unselect read voltages.

To generate a plurality of operating voltages having various voltage levels, the voltage generator 120 may include a plurality of pumping capacitors which receive the internal power voltage. The voltage generator 120 may generate the plurality of operating voltages by selectively enabling the plurality of pumping capacitors under the control of the control logic 150.

The plurality of operating voltages generated by the voltage generator 120 may be supplied to the memory cell array 110 by the address decoder 130.

The address decoder 130 may be connected to the memory cell array 110 through the row lines RL. The address decoder 130 may be operated under the control of the control logic 150. The address decoder 130 may receive an address ADDR from the control logic 150. The address decoder 130 may decode a block address in the received address ADDR. The address decoder 130 may select at least one memory block among the plurality of memory blocks BLK1 to BLKi according to the decoded block address. The address decoder 130 may decode a row address in the received address ADDR. The address decoder 130 may select at least one word line among word lines of the selected memory block according to the decoded row address. In an embodiment, the address decoder 130 may decode a column address in the received address ADDR. The address decoder 130 may connect the input/output circuit 140 and the memory cell array 110 to each other according to the decoded column address.

The address decoder 130 may include components such as a row decoder, a column decoder, and an address decoder.

The input/output circuit 140 may include a plurality of page buffers. The plurality of page buffers may be connected to the memory cell array 110 through the bit lines. In a program operation, data may be stored in selected memory cells according to data stored in the plurality of page buffers. In a read operation, the data stored in the selected memory cells may be sensed through the bit lines, and the sensed data may be stored in the page buffers.

The input/output circuit 140 may include a plurality of compressing circuits. The compressing circuits may be connected to a plurality of page buffers. More specifically, each of the compressing circuits may be connected to page buffers connected to memory banks corresponding thereto. The compressing circuits may be identical to the compressing circuits 1200 described in FIG. 1. The compressing circuit may compress and output data read from the memory cell array 110 when a compression read operation is performed under the control of the control logic 150.

The input/output circuit 140 may include a plurality of first merge circuits and a second merge circuit. The first merge circuit may be connected to two or more compressing circuits, and the second merge circuit may be connected to two or more first merge circuits. The first merge circuit and the second merge circuit may be identical to the first merge circuit 1300 and the second merge circuit 1400, which are described in FIG. 1. The first merge circuit may merge and output data output from compressing circuits, and the second merge circuit may merge and output data output from first merge circuits. More specifically, the first merge circuit may merge compressed data corresponding to the memory banks grouped as the above-described first merge group, and the second merge circuit may merge first merged data corresponding to the first merge groups grouped as the above-described second merge group.

The input/output circuit 140 may further include a clock signal generator and a clock signal adjuster. In an embodiment, the clock signal generator may generate a clock signal, using a voltage generated by the voltage generator 120, or generate a clock signal, using a voltage received from outside the memory device 100. Alternatively, in another embodiment, the clock signal generator may provide clock signals received from outside the memory cell array 110. The clock signal adjuster may adjust the clock signal output from the clock signal generator under the control of the control logic 150. In an embodiment, when the compression read operation is performed under the control of the control logic 150, the clock signal adjuster may adjust the clock signal output from the clock signal generator. The clock signal generator and the clock signal adjuster may be identical to the clock signal generator 1600 and the clock signal adjuster 1700, which are described in FIG. 4.

The control logic 150 may control the address decoder 130, the voltage generator 120, and the input/output circuit 140. The control logic 150 may be operated in response to a command CMD transferred from an external device. The control logic 150 may control the peripheral circuit by generating control signals in response to the command CMD and the address ADDR. The control logic 150 may control the peripheral circuit such that the memory device 100 performs a normal read operation or the compression read operation. The control logic 150 may be implemented as hardware, software, or a combination of hardware and software. For example, the control logic 150 may be a control logic circuit operating in accordance with an algorithm and/or a processor executing control logic code.

Figure 19:
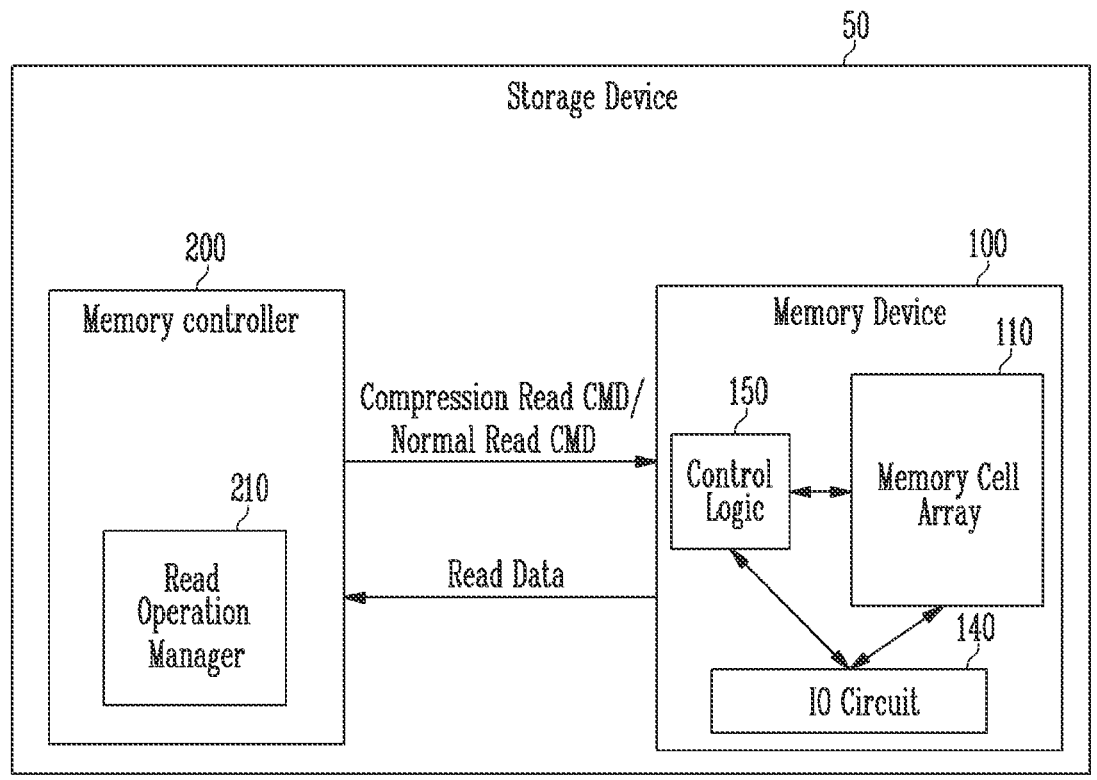
FIG. 19 is a block diagram illustrating a storage device including a memory device in accordance with an embodiment of the present disclosure.

FIG. 19 is a block diagram illustrating a storage device including a memory device in accordance with an embodiment of the present disclosure.

Referring to FIG. 19, the storage device 50 may include a memory device 100 and a memory controller 200. The storage device 50 may be a device for storing data under the control of a host, such as a mobile phone, a smart phone, an MP3 player, a laptop computer, a desktop computer, a game console, a TV, a tablet PC, or an in-vehicle infotainment. Alternatively, the storage device 50 may be a device for storing data under the control of the host for storing high-capacity data in one place, such as a server or a data center.

The storage device 50 may be manufactured as any one of various types of storage devices according to a host interface that is a communication scheme with the host. Also, the storage device 50 may be manufactured as any one of various kinds of package types.

The memory device 100 may store data. The memory device 100 may operate under the control of the memory controller 200. The memory device 100 may be the memory device 1000 or 100 shown in FIG. 1 or 18. Therefore, the memory device 100 may include a memory cell array 100 including a plurality of memory cells, an input/output (I/O) circuit 140 which is connected to the memory cell array 110 and outputs data read from the memory cells, and a control logic 150 which controls a peripheral circuit. The memory cell array 110 may include a plurality of memory banks each including a plurality of memory blocks. Each of the memory blocks may include a plurality of pages. In an embodiment, the page may be a unit for storing data in the memory device 100 or reading data stored in the memory device 100. The memory block may be a unit for erasing data.

In an embodiment, the memory device 100 may use any one of various types of volatile memory or nonvolatile memory. In this specification, for convenience of description, a case where the memory device 100 uses NAND flash memory is assumed and described.

The memory device 100 may receive a command and an address from the memory controller 200, and access an area selected by the address in the memory cell array. The memory device 100 may perform an operation indicated by the command on the area selected by the address. For example, the memory device 100 may perform a write operation (program operation), a read operation, and an erase operation. In the program operation, the memory device 100 may program data in the area selected by the address. In the read operation, the memory device 100 may read data from the area selected by the address. In the erase operation, the memory device 100 may erase data stored in the area selected by the address.

The memory controller 200 may control overall operations of the storage device 50.

When power is applied to the storage device 50, the memory controller 200 may execute firmware (FW). When the memory device 100 is a flash memory device, the memory controller 200 may execute FW such as a Flash Translation Layer (FTL) for controlling communication between the host and the memory device 100.

In an embodiment, the memory controller 200 may receive a Logical Address (LA) input from the host, and translate the LA into a Physical Address (PA) indicating addresses of memory cells in the memory device 100, in which data is to be stored or from which data is to be read.

The memory controller 200 may control the memory device 100 to perform a write operation, a read operation, an erase operation, or the like in response to a request from the host. In the program operation, the memory controller 200 may provide a write command, a PA, and data to the memory device 100. In the read operation, the memory controller 200 may provide a read command and a PA to the memory device 100. In the erase operation, the memory controller 200 may provide an erase command and a PA to the memory device 100.

In an embodiment, the memory controller 200 may autonomously generate a command, an address, and data regardless of any request from the host, and transmit the command, the address, and the data to the memory device 100. For example, the memory controller 200 may provide the memory device 100 with a command, an address, and data, which are used to perform program, read, and erase operations accompanied in performing wear leveling, read reclaim, garbage collection, and the like.

In an embodiment, the memory controller 200 may control at least two memory devices 100. The memory controller 200 may control the memory devices according to an interleaving scheme to improve operational performance. The interleaving scheme may be a scheme for controlling operations on at least two memory devices 100 to overlap with each other.

In an embodiment, the memory controller 200 may include a read operation manager 210. The read operation manager 210 may control the memory device 100 to perform a compression read operation or a normal read operation. For example, the read operation manager 210 may determine whether the memory device 100 is to perform the compression read operation or the normal read operation, and provide a compression read operation or a normal read command to the memory device 100 according to whether the memory device 100 is to perform the compression read operation or the normal read operation. The control logic 150 may control the peripheral circuit including the I/O circuit 140 to perform the compression read operation or the normal read operation in response to the received command. Accordingly, data read from the memory cell array 110 may be output to the memory controller 200 through the I/O circuit 140. When the memory device 100 receives the compression read command, the I/O circuit 140 may provide the memory controller 200 with read data compressed through a compression operation. When the memory device 100 receives the normal read command, the I/O circuit 140 may provide the memory controller 200 with read data which does not go through the compression operation.

In an embodiment, the compression read operation may be performed using an Efficient Soft Sensing (ESS) scheme. The ESS scheme may be a scheme of simultaneously compressing data of a plurality of areas in the memory cell array 110 and merging and outputting the compressed data together.

Figure 20:
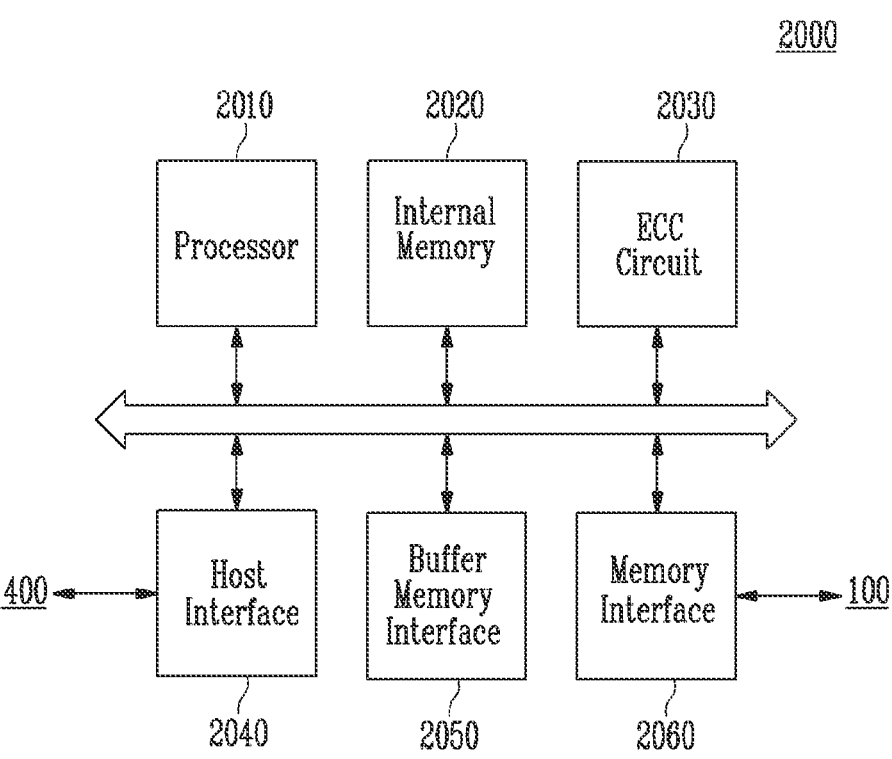
FIG. 20 is a diagram illustrating another embodiment of a memory controller shown in FIG. 19.

FIG. 20 is a diagram illustrating another embodiment of the memory controller shown in FIG. 19.

Referring to FIG. 20, a memory controller 2000 may include a processor 2010, an internal memory 2020, an Error Checking & Correcting (ECC) circuit 2030, a host interface 2040, a buffer memory interface 2050, and a memory interface 2060.

The processor 2010 may perform various calculations for controlling the memory device 100 or generate various commands. When the processor 2010 receives a request from the host 400, the processor 2010 may generate a command according to the received request and transmit the generated command to a queue controller (not shown). The processor 2010 may control a next operation on the memory device 100, based on a verify result which the memory interface 2060 receives from the memory device 100. In an embodiment, the processor 2010 may generate a normal read command or a compression read command.

The internal memory 2020 may store various information necessary for operation of the memory controller 2000. For example, the internal memory 2020 may include logical and physical address map tables.

The ECC circuit 2030 is configured to detect and correct an error of data received from the memory device 100 by using an error correction code. The processor 2010 may adjust a read voltage according to an error detection result of the ECC circuit 2030 and control the memory device 100 to perform re-reading. In an embodiment, an error correction block may be provided as a component of the memory controller 2000.

The host interface 2040 may exchange commands, addresses, data, and the like between the memory controller 2000 and the host 400. For example, the host interface 2040 may receive requests, addresses, data, and the like from the host 400, and output data read from the memory device 100 to the host 400. The host interface 2040 may communicate with the host 400, using various protocols.

The buffer memory interface 2050 may transfer data between the processor 2010 and a buffer memory. The buffer memory may be used as a working memory or a cache memory of the memory controller 2000, and store data used in the storage device. The buffer memory may be used as a read buffer, a write buffer, a map buffer, or the like by the processor 2010.

The memory interface 1060 may exchange commands, addresses, data, and the like between the memory controller 2000 and the memory device 100. For example, the memory interface 2060 may transmit commands, addresses, data, and the like to the memory device 100 through a channel and may receive data and the like from the memory device 100. The memory interface 2060 may provide the compression read command or the normal read command to the memory device 100 according to an instruction of the processor 2010. Accordingly, the memory interface 2060 may receive compression read data or normal read data from the memory device 100.

Figure 21:
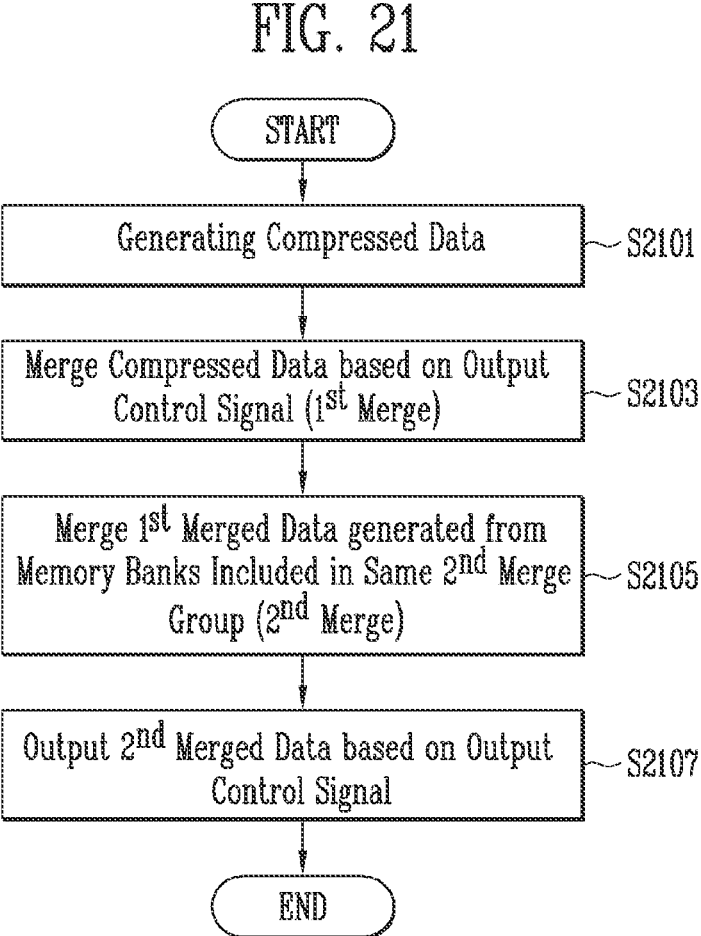
FIG. 21 is a flowchart illustrating an operating method of a memory device in accordance with an embodiment of the present disclosure.

FIG. 21 is a flowchart illustrating an operating method of a memory device in accordance with an embodiment of the present disclosure.

Referring to FIGS. 1 and 21, in operation S2101, the compressing circuits 1200 of the memory device 1000 may compress read data R.DATA provided from the memory banks 1100, and accordingly, compressed data C.DATA may be generated from the compressing circuits 1200.

In operation S2103, the first merge circuits 1300 of the memory device 1000 may merge the compressed data C.DATA, based on an output control signal OUTPUT_CTR output from the memory banks 1100, and the merging of the compressed data C.DATA by the first merge circuits 1300 may be designated as first merging. In the first merging, compressed data corresponding to the memory banks grouped as the first merge group 1120 may be merged. In an embodiment, the first merge group may be configured with memory banks adjacent to each other. In an embodiment, the first merge group 1120 may be configured with memory banks 1100 included in different memory planes 1110. In an embodiment, the compressed data C.DATA output from the compressing circuits 1200 may be latched to the first merge circuits 1300, and first merged data 1st M.DATA as latched may be output from the first merge circuit 1300 in response to the output control signal OUTPUT_CTR.

In operation S2105, the second merge circuit 1400 of the memory device 1000 may merge the first merged data $1^{st}$ M.DATA, and the merging of the first merged data $1^{st}$ M.DATA by the second merge circuit 1400 may be designated as second merging. In the second merging, compressed data corresponding to the memory banks grouped as the second merge group 1140 may be merged. The second merge group 1140 may be configured with a plurality of memory banks 1100 included in the same plane group 1130. The plane group 1130 is configured with memory planes 1110 sharing a peripheral circuit, and one plane group 1130 may include one or more second merge groups 1140. In an embodiment, the second merge group 1140 may be configured with memory banks 1100 physically adjacent to each other. More specifically, the second merge group 1140 may be configured with first merge groups 1120 physically adjacent to each other. The second merge circuit 1140 may output, to the output buffer circuit 1500, second merged data $2^{nd}$ M.DATA obtained by merging the first merged data $1^{st}$ M.DATA.

In operation S2107, the output buffer circuit 1500 of the memory device may merge the first merged data $1^{st}$ M.DATA, based on output control signals OUTPUT_CTR output from the memory banks 1100. In an embodiment, the second merged data $2^{nd}$ M.DATA output from the second merge circuit 1400 may be latched to the output buffer circuit 1500, and the latched data may be output from the output buffer circuit 1500 in response to at least some output control signals OUTPUT_CTR selected among the output control signals OUTPUT_CTR output from the memory banks 1100.

FIG. 22 is a flowchart illustrating a process of providing a clock signal to each of memory banks in the operating method of the memory device in accordance with an embodiment of the present disclosure.

Referring to FIGS. 1, 4, and 22, in operation S2201, clock signals may be output from the clock signal generator 1600 of the memory device 1000. In an embodiment, the clock signal generator 1600 may generate clock signals by using an internal power source of the memory device 1000 or a power source outside the memory device 1000. In another embodiment, the clock signal generator 1600 may output clock signals provided from outside of the memory device 1000.

In operation S2203, the clock signal adjuster 1700 of the memory device 1000 may check whether a compression read operation has been enabled. When the compression read operation is enabled, in operation S2205, the clock signal adjuster 1700 may adjust at least a portion of clock signals to be respectively provided to memory banks 1100. In an embodiment, the clock signal adjuster 1700 may delay a clock signal to be provided to at least a portion of the memory banks 1100. In operation S2207, the clock signal adjusted by the clock signal adjuster 1700 may be provided to the memory banks 1100.

When the compression read operation is not enabled, the clock signal adjuster 1700 might not adjust clock signals, and the unadjusted clock signals may be provided to the memory banks 1100 in the operation S2207.

Output control signals respectively corresponding to the memory banks 1100 may be generated based on the clock signals provided to the memory banks 1100, and data may be output from the memory banks 1100 in response to the output control signals.

Figure 23:
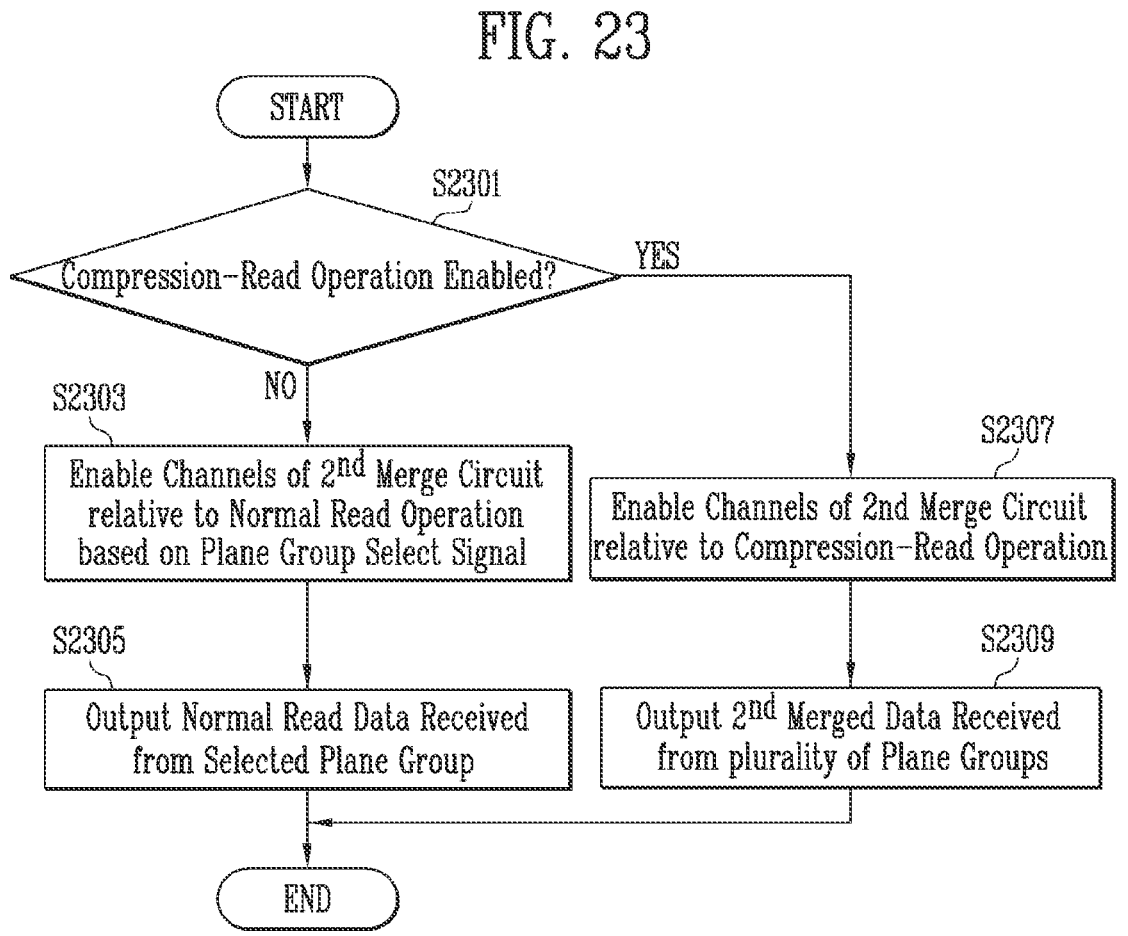
FIG. 23 is a flowchart illustrating an operation of the second merge circuit in the operating method of the memory device in accordance with an embodiment of the present disclosure.

FIG. 23 is a flowchart illustrating an operation of the second merge circuit in the operating method of the memory device in accordance with an embodiment of the present disclosure.

Referring to FIGS. 1, 9, and 23, in operation S2301, the second merge circuit 1400 of the memory device 1000 may check whether a compression read operation has been enabled. In an embodiment, the second merge circuit 1400 may receive a compression read enable signal indicating whether the compression read operation has been enabled, and perform the operation S2301, based on the compression read enable signal.

When the compression read operation is not enabled, i.e., when a normal read operation is performed, in operation S2303, the second merge circuit 1400 may enable channels corresponding to the normal read operation. In an embodiment, the second merge circuit 1400 may enable at least a portion of channels connected to a plane group 1130 to be selected among a plurality of plane groups, based on a plane group select signal indicating the plane group 1130 to be selected.

In operation S2305, the second merge circuit 1400 may receive normal read data from the selected plane group 1130 through the enabled channels and output the received normal read data.

When the compression read operation is enabled, i.e., when the compression read operation is performed, in operation S2307, the second merge circuit 1400 may enable channels corresponding to the compression read operation. In an embodiment, the second merge circuit 1400 may enable at least a portion of channels connected to one or more plane groups 1130 among the plurality of plane group 1130, based on a select signal indicating that the one or more plane groups 1130 will be selected.

In operation S2309, the second merge circuit 1400 may receive first merged data $1^{st}$ M.DATA from the one or more plane groups 1130 through the enabled channels, and output second merged data $2^{nd}$ M.DATA by merging the received first merge data $1^{st}$ M.DATA. In an embodiment, the second merge circuit 1400 may receive the first merged data $1^{st}$ M.DATA from the plurality of plane groups 1130, but the present disclosure is not limited thereto. In an embodiment, the first merged data $1^{st}$ M.DATA may be received from one plane group 1130.

In accordance with the present disclosure is a memory device and an operating method of a memory device which can mitigate, reduce, or prevent a merge failure which may occur in a merge process of data when a compression read operation is performed.

While the present disclosure has been shown and described with reference to certain embodiments thereof, it will be understood by those skilled in the art that various changes in form and detail may be made therein without departing from the spirit and scope of the present disclosure as defined by the appended claims and their equivalents. Therefore, the scope of the present disclosure should not be limited to the above-described embodiments but should be determined by not only the appended claims but also the equivalents thereof.

In the above-described embodiments, all steps may be selectively performed or some of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, some embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A memory device comprising:
a plurality of memory planes each including a plurality of memory banks, the plurality of memory planes being grouped into memory planes sharing at least one peripheral circuit to constitute one or more plane groups;
a plurality of compressing circuits respectively connected to the plurality of memory banks, the plurality of compressing circuits configured to output compressed data by respectively compressing data read from the plurality of memory banks in a compression read operation;
a plurality of first merge circuits configured to receive the compressed data and output control signals corresponding to at least a portion of the memory banks, the plurality of first merge circuits configured to output first merged data obtained by merging compressed data corresponding to memory banks grouped as a first merge group, based on the output control signals;
a second merge circuit configured to receive the first merged data from the first merge circuits, the second merge circuit configured to output second merged data obtained by merging first merged data generated from memory banks included in the same plane group; and
an output buffer circuit configured to latch the second merged data, the output buffer circuit configured to output the second merged data, based on at least a portion of the output control signals.

2. The memory device of claim 1,
wherein each of the one or more plane groups includes at least one second merge group in which memory banks physically adjacent to each other are grouped.

3. The memory device of claim 2,
wherein the second merge circuit is configured to merge first merged data generated from memory banks included in the same second merge group.

4. The memory device of claim 2,
wherein, in the first merge group, memory banks are grouped, which are included in the same second merge group and are included in different memory planes.

5. The memory device of claim 4, further comprising:
a clock signal generator configured to output clock signals to be provided to the memory banks in the first merge group; and
a clock signal adjustor configured to adjust at least a portion of the clock signals, based on a compression read enable signal indicating whether the compression read operation has been enabled,
wherein the output control signals are generated based on the clock signals.

6. The memory device of claim 5,
wherein the clock signal adjuster is configured to delay a clock signal provided to at least a portion of memory banks included in the second merge group.

7. The memory device of claim 3,
wherein first merged data respectively generated from first merge groups, which are included in the same second merge group, are output from the first merge circuits to be synchronized with each other.

8. The memory device of claim 4, wherein the second merge circuit includes:
a data merge circuit configured to receive first merged data from the first merge circuits, and output the second merged data; and
a signal select circuit configured to select a portion of the output control signals, thereby providing the output buffer circuit with output control signals respectively corresponding to the second merge groups.

9. The memory device of claim 8,
wherein the data merge circuit includes a first channel unit and a second channel unit, to which data respectively generated from first merge groups included in any one second merge group in a first plane group among a plurality of plane groups are input, and a third channel unit to which data generated from first merge groups included in any one second merge group in a second plane group different from the first plane group are input.

10. The memory device of claim 9, wherein the data merge circuit is configured to:
receive a compression read enable signal indicating whether the compression read operation has been enabled and a plane group select signal indicating a plane group to be selected among the plurality of plane groups; and
enable at least a portion selected from a group consisting of the first channel unit, the second channel unit, and the third channel unit, based on at least one selected from a group consisting of the compression read enable signal and the plane group select signal.

11. The memory device of claim 10,
wherein the data merge circuit is configured to enable at least a portion of channels included in the first channel unit when the compression read enable signal indicates disablement of the compression read operation and the plane group select signal indicates selection of the first plane group.

12. The memory device of claim 10,
wherein the data merge circuit is configured to enable at least a portion of channels included in the third channel unit when the compression read enable signal indicates disablement of the compression read operation and the plane group select signal indicates selection of the first plane group.

13. The memory device of claim 10,
wherein the data merge circuit is configured to enable at least a portion of channels included in the first channel unit and at least a portion of channels included in the second channel unit when the compression read enable signal indicates enablement of the compression read operation.

14. The memory device of claim 8,
wherein the signal select circuit is configured to select an output control signal corresponding to any one of memory banks included in the second merge group as an output control signal corresponding to the second merge group.

15. A method of operating a memory device, the method comprising:
generating compressed data obtained by respectively compressing data read from a plurality of memory banks respectively included in a plurality of memory planes;
performing first merging on the compressed data respectively corresponding to memory banks grouped as a first merge group, based on output control signals corresponding to at least a portion of the memory banks;
performing, for each second merge group, second merging on first merged data among the first merged data obtained by performing the first merging, the first merged data being respectively generated from memory banks included in the second merge group; and
outputting second merged data obtained by performing the second merging, based on at least a portion of the output control signals,
wherein the plurality of memory planes are grouped into memory planes sharing at least one peripheral circuit to constitute one or more plane groups, and
wherein the second merge group is grouped into memory banks included in the same plane group.

16. The method of claim 15,
wherein the second merge group comprises memory banks physically adjacent to each other.

17. The method of claim 16,
wherein the first merge group comprises memory banks which are included in the same second merge group and are included in different memory planes.

18. The method of claim 16,
wherein each of the one or more plane groups includes one or more second merge groups.

19. The method of claim 15, further comprising:
generating, before generating the compressed data, a clock signal to be supplied to the plurality of memory planes; and
adjusting a clock signal to be supplied to at least a portion of the plurality of memory banks.

20. The method of claim 19,
wherein the first merged data generated from the memory banks included in the same second merge group are output to be synchronized with each other.

* * * * *